(12) United States Patent
Ko et al.

(10) Patent No.: US 12,308,367 B2
(45) Date of Patent: May 20, 2025

(54) NONVOLATILE MEMORY DEVICE WITH OPENINGS IN THE SUBSTRATE AND NONVOLATILE MEMORY SYSTEM INCLUDING THE SAME

(71) Applicant: Samsung Electronics Co., Ltd., Suwon-si (KR)

(72) Inventors: Kyung Min Ko, Seoul (KR); Myung Hun Lee, Seongnam-si (KR); Pan Suk Kwak, Goyang-si (KR); Dae Seok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 714 days.

(21) Appl. No.: 17/409,681

(22) Filed: Aug. 23, 2021

(65) Prior Publication Data

US 2022/0190131 A1 Jun. 16, 2022

(30) Foreign Application Priority Data

Dec. 16, 2020 (KR) ........................ 10-2020-0175992

(51) Int. Cl.
*H01L 29/423* (2006.01)
*H01L 23/522* (2006.01)
(Continued)

(52) U.S. Cl.
CPC .... *H01L 29/42324* (2013.01); *H01L 23/5226* (2013.01); *H01L 23/5283* (2013.01);
(Continued)

(58) Field of Classification Search
CPC ........... H01L 29/42324; H01L 23/5226; H01L 23/5283; H01L 21/76898; H10B 41/10;
(Continued)

(56) References Cited

U.S. PATENT DOCUMENTS 9,111,592 B2 8/2015 Maejima
9,653,562 B2 5/2017 Kim et al.
(Continued)

FOREIGN PATENT DOCUMENTS

KR 10-2007-0122131 A 12/2007
KR 10-2020-0073339 A 6/2020

*Primary Examiner* — Marcos D. Pizarro
*Assistant Examiner* — Tiberiu Dan Onuta
(74) *Attorney, Agent, or Firm* — Muir Patent Law, PLLC

(57) ABSTRACT

A nonvolatile memory device includes a peripheral logic structure including a peripheral circuit on a substrate, a horizontal semiconductor layer extending along an upper surface of the peripheral logic structure, stacked structures arranged in a first direction on the horizontal semiconductor layer and including interlayer insulating films and conductive films alternately stacked in a direction perpendicular to the substrate, a first opening disposed between the stacked structures and included in the horizontal semiconductor layer to expose a part of the peripheral logic structure and a second opening arranged in a second direction, which differs from the first direction, from the first opening, included in the horizontal semiconductor layer, and disposed adjacent to the first opening. The peripheral logic structure includes a control transistor overlapping the second opening in a plan view and controlling operation of the plurality of stacked structures.

19 Claims, 24 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 41/41* (2023.01)
*H10B 43/10* (2023.01)
*H10B 43/27* (2023.01)
*H10B 43/35* (2023.01)
*H10B 43/40* (2023.01)

(52) U.S. Cl.
CPC .............. *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(58) Field of Classification Search
CPC ........ H10B 41/27; H10B 41/35; H10B 41/41; H10B 41/20; H10B 41/50; H10B 43/10; H10B 43/27; H10B 43/35; H10B 43/40; H10B 43/20; H10B 43/50; G11C 16/0483
See application file for complete search history.

(56) References Cited

U.S. PATENT DOCUMENTS

| | | |
|---|---|---|
| 10,319,729 B2 | 6/2019 | Hasegawa et al. |
| 10,438,998 B2 * | 10/2019 | Lee ........................ H10B 63/30 |
| 10,446,565 B2 | 10/2019 | Oh et al. |
| 10,522,460 B2 | 12/2019 | Ichinose et al. |
| 10,522,560 B2 | 12/2019 | Lee |
| 10,566,343 B2 | 2/2020 | Oh et al. |
| 11,456,335 B2 * | 9/2022 | Lim ........................ H10B 43/40 |
| 2016/0163635 A1 * | 6/2016 | Yun ........................ H01L 23/528 257/659 |
| 2020/0194448 A1 * | 6/2020 | Kim ..................... H01L 23/5226 |
| 2021/0358545 A1 * | 11/2021 | Schreck ............. G11C 13/0028 |
| 2022/0068392 A1 * | 3/2022 | You ........................ G06F 3/0659 |

* cited by examiner

NONVOLATILE MEMORY DEVICE WITH OPENINGS IN THE SUBSTRATE AND NONVOLATILE MEMORY SYSTEM INCLUDING THE SAME

This application claims priority to Korean Patent Application No. 10-2020-0175992 filed on Dec. 16, 2020 in the Korean Intellectual Property Office, the disclosure of which is herein incorporated by reference in its entirety.

BACKGROUND

1. Field of the Disclosure

The present disclosure relates to a nonvolatile memory device and a nonvolatile memory system including the same.

2. Description of the Related Art

Nonvolatile memory devices for storing a large amount of data are required in electronic systems which need to store data. Accordingly, research is underway on a method of increasing the data storage capacity of a highly integrated nonvolatile memory device. For example, as a method of increasing the data storage capacity of a nonvolatile memory device, nonvolatile memory devices including three-dimensionally arranged memory cells instead of two-dimensionally arranged memory cells are being proposed.

Methods of reducing the chip size of a nonvolatile memory device are being proposed.

SUMMARY

Aspects of the present disclosure provide a nonvolatile memory device which is highly integrated by efficiently arranging a configuration of a peripheral circuit.

Aspects of the present disclosure also provide a memory system including a nonvolatile memory device which is highly integrated by efficiently arranging a configuration of a peripheral circuit.

Aspects of the present disclosure also provide a nonvolatile memory device in which the number of through-hole vias is reduced by efficiently arranging a configuration of a peripheral circuit to improve operation performance.

Aspects of the present disclosure also provide a memory system including a nonvolatile memory device in which the number of through-hole vias is reduced by efficiently arranging a configuration of a peripheral circuit to improve operation performance.

It should be noted that objects of the present disclosure are not limited to the above-described objects, and other objects of the present disclosure will be apparent to those skilled in the art from the following descriptions.

According to some embodiments for achieving the aforementioned technical problems, there is provided a nonvolatile memory device comprises a peripheral logic structure including a peripheral circuit on a substrate, a horizontal semiconductor layer extending along an upper surface of the peripheral logic structure, a plurality of stacked structures arranged in a first direction on the horizontal semiconductor layer and including interlayer insulating films and conductive films alternately stacked in a direction perpendicular to the substrate, a first opening disposed between two adjacent stacked structures of the plurality of stacked structures and included in the horizontal semiconductor layer to expose a part of the peripheral logic structure and a second opening arranged in a second direction, which differs from the first direction, from the first opening, included in the horizontal semiconductor layer, and disposed adjacent to the first opening. The peripheral logic structure includes control logic with a control transistor overlapping the second opening in a plan view. The control logic controls operation of the plurality of stacked structures.

According to some embodiments for achieving the aforementioned technical problems, there is provided a nonvolatile memory device comprises a peripheral logic structure including a peripheral circuit on a substrate, a horizontal semiconductor layer extending along an upper surface of the peripheral logic structure, a first stacked structure including a first conductive film stacked on the horizontal semiconductor layer in a direction perpendicular to the substrate, a pass transistor configured to apply an operating voltage to the first conductive film and disposed in the peripheral logic structure and a control transistor connected to a source/drain of the pass transistor. The peripheral circuit includes control logic to control the operating voltage. The control logic includes the control transistor. The control transistor and the pass transistor are connected through a lower interconnection structure which is disposed under the upper surface of the peripheral logic structure.

According to some embodiments for achieving the aforementioned technical problems, there is provided a nonvolatile memory system comprises a main board, a nonvolatile memory device disposed on the main board and a controller disposed on the main board and electrically connected to the nonvolatile memory device, wherein the nonvolatile memory device includes a peripheral logic structure including a peripheral circuit on a substrate, a horizontal semiconductor layer extending along an upper surface of the peripheral logic structure, a plurality of stacked structures arranged in a first direction on the horizontal semiconductor layer and including interlayer insulating films and conductive films alternately stacked in a direction perpendicular to the substrate, a first opening disposed between two adjacent stacked structures of the plurality of stacked structures and included in the horizontal semiconductor layer to expose a part of the peripheral logic structure and a second opening arranged in a second direction, which differs from the first direction, from the first opening, included in the horizontal semiconductor layer, and disposed adjacent to the first opening. The peripheral logic structure includes control logic with a control transistor overlapping a region defined by the second opening in a plan view, and the control logic controls operation of the plurality of stacked structures.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Figure 1:
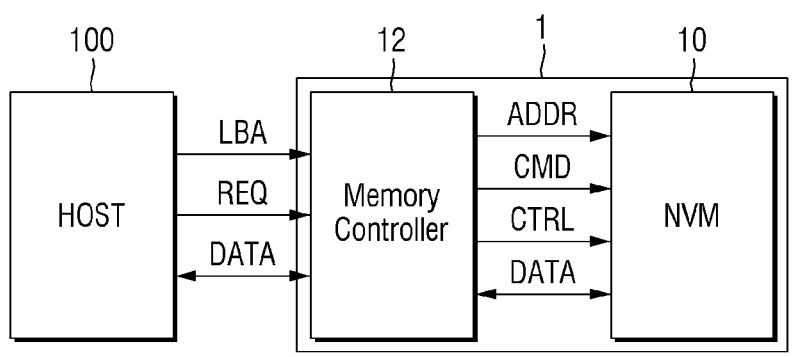
FIG. 1 is a block diagram illustrating an electronic system according to some exemplary embodiments of the present disclosure.

Hereinafter, exemplary embodiments according to the technical spirit of the present disclosure will be described with reference to the accompanying drawings. In the descriptions of FIGS. 1 to 24, the same reference numerals will be used for substantially the same elements, and an overlapping description of the same elements will be omitted. Throughout the drawings of the present disclosure, like reference numerals are used for like elements.

FIG. 1 is a block diagram illustrating an electronic system 1000 according to some exemplary embodiments of the present disclosure.

The electronic system 1000 may include a host 100 and a nonvolatile memory device 1. The host 100 and the nonvolatile memory device 1 may be electrically connected. The host 100 may provide a logical block address LBA and a request signal REQ to the nonvolatile memory device 1, and the host 100 and the nonvolatile memory device 1 may transmit and receive data DATA with each other. For example, the host 100 may be connected to a memory controller 12.

The host 100 may include, for example, a personal computer (PC), a laptop, a mobile phone, a smart phone, a tablet PC, or the like.

The nonvolatile memory device 1 may include the memory controller 12 and a nonvolatile memory 10. The nonvolatile memory device 1 may be integrated into one semiconductor device. For example, the nonvolatile memory device 1 may include an embedded universal flash storage (UFS) memory device, an embedded multimedia card (eMMC), a solid state drive (SSD), or the like. The nonvolatile memory 10 may include, for example, a removable UFS memory card, compact flash (CF) card, secure digital (SD) card, micro-SD card, mini-SD card, extreme digital (xD) card, memory stick, or the like.

The nonvolatile memory 10 may include a NAND flash memory. However, the exemplary embodiments according to the technical spirit of the present disclosure are not limited thereto, and the nonvolatile memory 10 may include a NOR flash memory or a resistive memory such as a phase-change random access memory (PRAM), a magneto resistive RAM (MRAM), a ferroelectric RAM (FeRAM), and a resistive RAM (RRAM).

The memory controller 12 may be connected to the nonvolatile memory 10 and control the nonvolatile memory 10. For example, the memory controller 12 may provide an address ADDR, a command CMD, a control signal CTRL, etc. to the nonvolatile memory 10 in response to the logical block address LBA, the request signal REQ, and the like. For example, the memory controller 12 may provide a signal to the nonvolatile memory 10 to control data to be written to the nonvolatile memory 10 or read from the nonvolatile memory 10. The memory controller 12 and the nonvolatile memory 10 may transmit and receive data DATA with each other.

The nonvolatile memory 10 may include a memory cell array 20 and a peripheral circuit 30.

The memory cell array 20 may include first to $n^{th}$ memory cell blocks BLK1 to BLKn. The first to $n^{th}$ memory cell blocks BLKa to BLKn may include a plurality of memory cells including a semiconductor element. Each memory cell may store data of one bit or data of two or more bits. A memory cell which may store data of one bit is referred to as a single level cell (SLC) or a single bit cell. A memory cell which may store data of two bits is referred to as a multi-level cell (MLC) or a multi-bit cell.

The first to $n^{th}$ memory cell blocks BLK1 to BLKn may be connected to the peripheral circuit 30 through bit lines BL, word lines WL, at least one string select line SSL, and at least one ground select line GSL.

For example, the first to $n^{th}$ memory cell blocks BLK1 to BLKn may be connected to a row decoder 33 through the word lines WL, the at least one string select line SSL, and the at least one ground select line GSL. The first to $n^{th}$ memory cell blocks BLK1 to BLKn may be connected to a page buffer 35 through the bit lines BL.

The peripheral circuit 30 may receive an address ADDR, a command CMD, and a control signal CTRL from the outside of the nonvolatile memory 10 and may transmit and receive data DATA with a device outside the nonvolatile memory 10. The peripheral circuit 30 may include control logic 37, the row decoder 33, the page buffer 35, and a voltage generator 38 which generates various voltages required for operation.

Although not shown in the drawing, the peripheral circuit 30 may further include various sub-circuits such as an input/output circuit and an error correction circuit for correcting an error of data DATA read from the memory cell array 20 of the nonvolatile memory 10.

The control logic 37 may be connected to the row decoder 33, the voltage generator 38, and the input/output circuit.

The control logic 37 may control the overall operation of the nonvolatile memory 10. The control logic 37 may generate various internal control signals used in the nonvolatile memory 10 in response to the control signal CTRL, serve as a controller of the memory cell array 20, and store setting data (e.g., operation mode information) for the operation of the memory cell array 20 in the form of electrical fuse (eFuse). For example, the control logic 37 may include electrically programmable fuses to store the setting data.

Unlike laser fuse which is conventionally used, eFuse refers to a method of storing various types of information in a latch and the like included in the peripheral circuit 30, reading the information upon the operation of a memory chip, and transferring the information by turning on or off a corresponding switch. Information stored in the form of eFuse includes direct current (DC) trim information, option information, repair and bad block information, etc. for chip operation. Such information required for chip operation is stored in advance at a test stage for a specific region of a memory cell.

For example, the control logic 37 may adjust a voltage level of an operating voltage provided to the word lines WL and the bit lines BL in the case of performing a memory operation such as a program operation or an erase operation.

The row decoder 33 includes a plurality of pass transistors 33_1 to 33_10 (see FIG. 5) and may select at least one of the first to n$^{th}$ memory cell blocks BLK1 to BLKn in response to the address ADDR. The plurality of pass transistors 33_1 to 33_10 may select at least one word line WL, at least one string select line SSL, and at least one ground select line GSL of the selected memory cell block.

Figure 5:
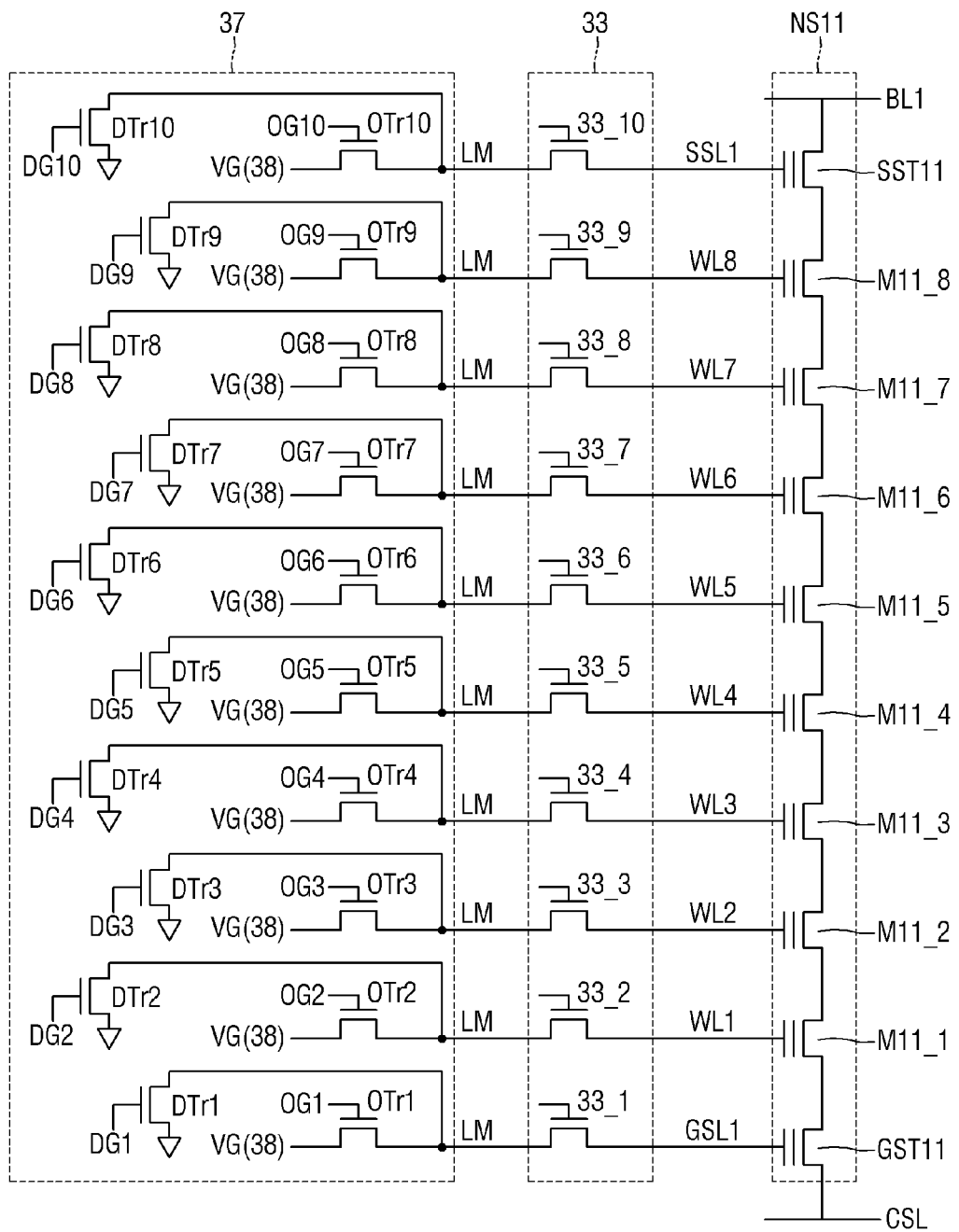
FIG. 5 is a circuit diagram showing a cell string of a memory cell block and a part of a row decoder according to some exemplary embodiments of the present disclosure.

The row decoder 33 according to some exemplary embodiments of the present disclosure may transfer an operating voltage for performing a memory operation to the word line WL of the selected memory cell block through the plurality of pass transistors 33_1 to 33_10 (see, FIG. 5).

The voltage generator 38 may be controlled by the control logic 37 and transfer the operating voltage, which is transferred to the memory cell array 20 to perform the memory operation, to the plurality of pass transistors 33_1 to 33_10 of the row decoder 33 through the control logic 37.

The voltage generator 38 may generate a high voltage (e.g., 20 V) applied to a substrate when an erase operation is performed on at least one of the first to n$^{th}$ memory blocks BLK1 to BLKn.

The page buffer 35 may be connected to the memory cell array 20 through the bit lines BL. The page buffer 35 may operate as a writer driver or a sense amplifier. For example, while a program is executed, the page buffer 35 may operate as a write driver to apply voltages according to data DATA to be stored in the memory cell array 20 to the bit lines BL. Meanwhile, in the case of a write operation or a verification operation, the page buffer 35 may operate as a sense amplifier to sense data DATA stored in the memory cell array 20 and sense whether data of a memory cell block has been erased.

Figure 3:
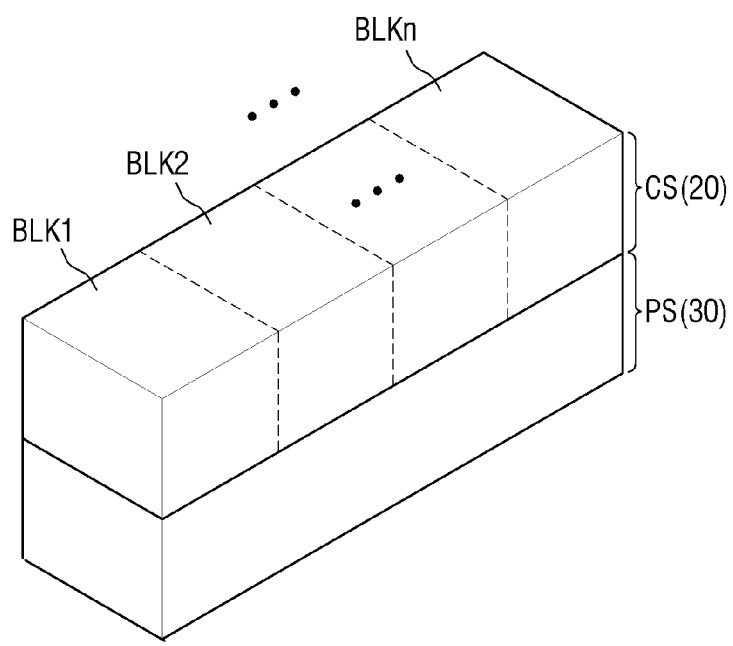
FIG. 3 is a perspective view showing a nonvolatile memory device according to some exemplary embodiments of the present disclosure.

FIG. 3 is a perspective view showing a nonvolatile memory device according to some exemplary embodiments of the present disclosure.

Referring to FIG. 3, a semiconductor memory device according to some exemplary embodiments may include a peripheral logic structure PS and a cell array structure CS.

The cell array structure CS may be stacked on the peripheral logic structure PS. For example, the peripheral logic structure PS and the cell array structure CS may overlap in a plan view. The semiconductor memory device according to some exemplary embodiments may have a cell over peri (COP) structure.

Figure 2:
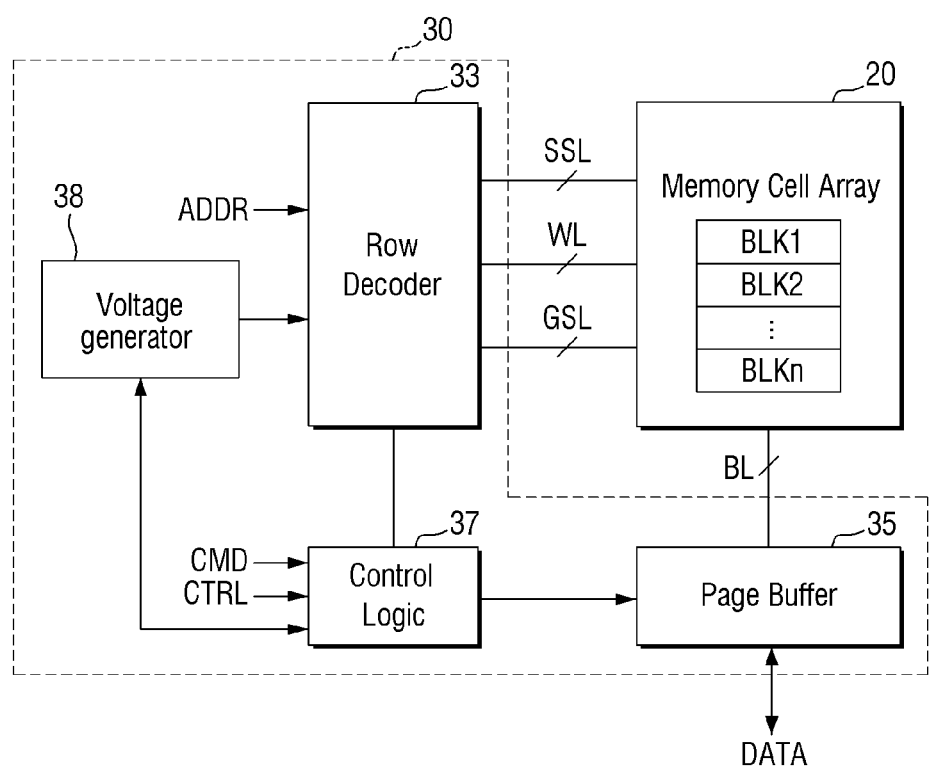
FIG. 2 is a block diagram illustrating a nonvolatile memory device according to some exemplary embodiments of the present disclosure.

For example, the cell array structure CS may include the memory cell array 20 of FIG. 2. The peripheral logic structure PS may include the peripheral circuit 30 of FIG. 2.

The cell array structure CS may include the plurality of memory cell blocks BLK1 to BLKn disposed on the peripheral logic structure PS.

Figure 4:
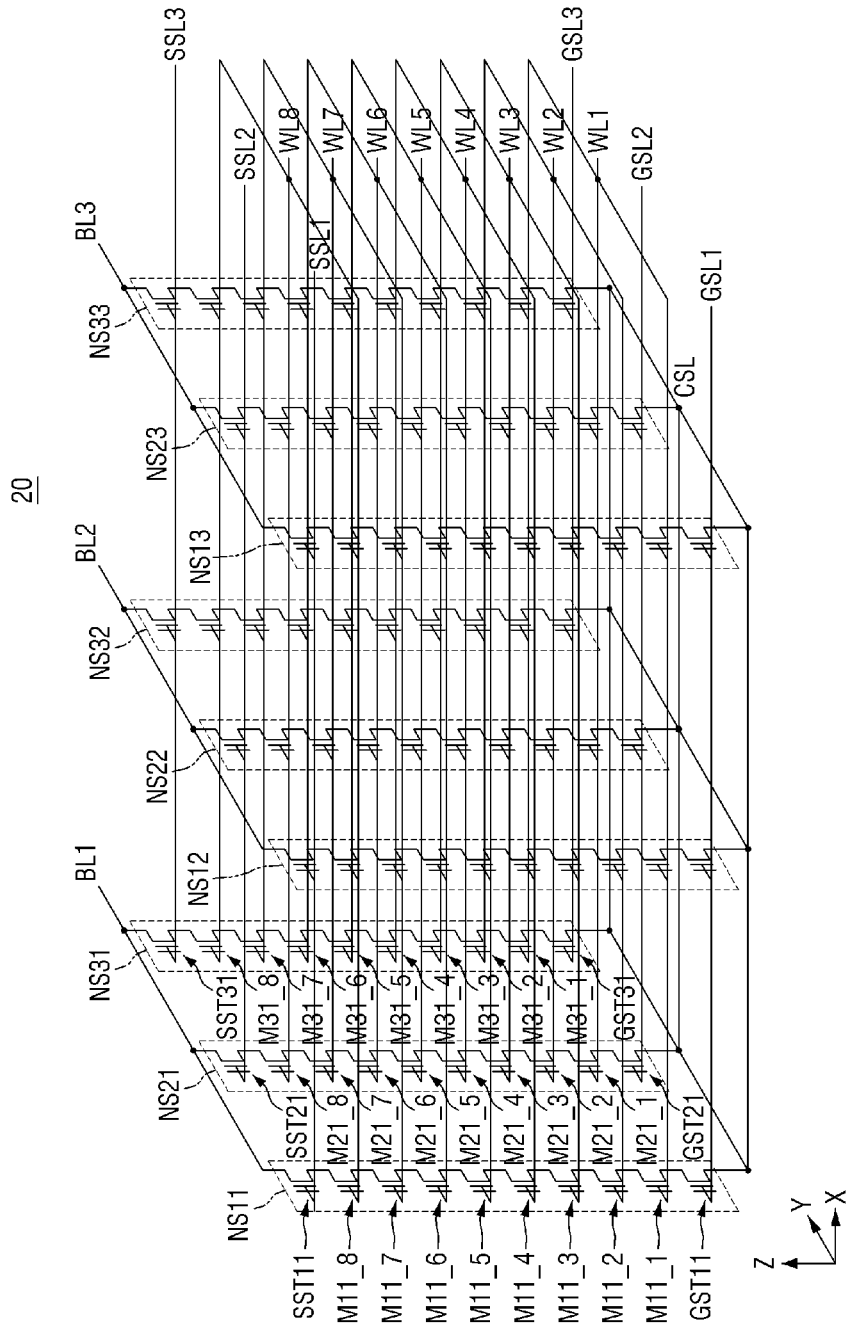
FIG. 4 is an exemplary circuit diagram of a memory cell array according to some exemplary embodiments of the present disclosure.

FIG. 4 is an exemplary circuit diagram of a memory cell array according to some exemplary embodiments of the present disclosure.

Referring to FIG. 4, a plurality of cell strings NS11, NS21, NS31, NS12, NS22, NS32, NS13, NS23, and NS33 may be disposed in a first direction x and a second direction y on a substrate (not shown). The plurality of cell strings NS11, NS21, NS31, NS12, NS22, NS32, NS13, NS23, and NS33 may extend in a third direction z. The plurality of cell strings NS11, NS21, NS31, NS12, NS22, NS32, NS13, NS23, and NS33 may be connected in common to a common source line CSL which is formed on the substrate (not shown) or in the substrate (not shown). In the drawing, the common source line CSL is connected at the lowermost ends of the plurality of cell strings NS11, NS21, NS31, NS12, NS22, NS32, NS13, NS23, and NS33 in the third direction. However, the common source line CSL is only required to electrically connected to the lowermost ends of the plurality of cell strings NS11, NS21, NS31, NS12, NS22, NS32, NS13, NS23, and NS33 in the third direction z and is not required to be physically disposed under the plurality of cell strings NS11, NS21, NS31, NS12, NS22, NS32, NS13, NS23, and NS33. In the drawing, the plurality of cell strings NS11, NS21, NS31, NS12, NS22, NS32, NS13, NS23, and NS33 are disposed in a 3×3 array, but the arrangement and number of cell strings disposed in the nonvolatile memory cell array 20 are not limited thereto.

Some cell strings NS11, NS12, and NS13 may be connected to a first ground select line GSL1. Some cell strings NS21, NS22, and NS23 may be connected to a second ground select line GSL2. Some cell strings NS31, NS32, and NS33 may be connected to a third ground select line GSL3.

Some cell strings NS11, NS12, and NS13 may be connected to a first string select line SSL1. Some cell strings NS21, NS22, and NS23 may be connected to a second string select line SSL2. Some cell strings NS31, NS32, and NS33 may be connected to a third string select line SSL3.

Each of the plurality of cell strings NS11, NS21, NS31, NS12, NS22, NS32, NS13, NS23, and NS33 may include a string select transistor (SST) which is connected to one of the string select lines SSL1 to SSL3. Each of the plurality of cell strings NS11, NS21, NS31, NS12, NS22, NS32, NS13, NS23, and NS33 may include a ground select transistor (GST) which is connected to one of the ground select lines GSL1 to GSL3.

One ends of the GSTs of the plurality of cell strings NS11, NS21, NS31, NS12, NS22, NS32, NS13, NS23, and NS33 may be connected to the common source line CSL. In each of the plurality of cell strings NS11, NS21, NS31, NS12, NS22, NS32, NS13, NS23, and NS33, a plurality of memory cells may be sequentially stacked in the third direction z between the GST and the SST. Although not shown in the drawing, each of the plurality cell strings NS11, NS21, NS31, NS12, NS22, NS32, NS13, NS23, and NS33 may include dummy cells between the GST and the SST. The number of SSTs included in each string is not limited to the number of SSTs shown in the drawing.

For example, the cell string NS11 may include a GST GST11 disposed at the lowermost end thereof in the third direction z, a plurality of memory cells M11_1 to M11_8 sequentially stacked on the GST GST11 in the third direction z, and an SST SST11 stacked on the uppermost memory cell M11_8 in the third direction z. The cell string NS21 may include a GST GST21 disposed at the lowermost end thereof in the third direction z, a plurality of memory cells M21_1 to M21_8 sequentially stacked on the GST GST21 in the third direction z, and an SST SST21 stacked on the uppermost memory cell M21_8 in the third direction z. The cell string NS31 may include a GST GST31 disposed at the lowermost end thereof in the third direction z, a plurality of memory cells M31_1 to M31_8 sequentially stacked on the GST GST31 in the third direction z, and an SST SST31 stacked on the uppermost memory cell M31_8 in the third direction z. Configurations of the other strings may be similar to those described above.

The memory cells disposed at the same height in the third direction z from substrate (not shown) or the GSTs may be electrically connected in common through a word line. For example, the memory cells disposed at a height at which the memory cells M11_1, M21_1, and M31_1 are formed may be connected to a first word line WL1. The memory cells disposed at a height at which the memory cells M11_2, M21_2, and M31_2 are formed may be connected to a second word line WL2. The arrangement and structure of memory cells connected to a third word line WL3 to an eighth word line WL8 are similar to those described above, and thus descriptions thereof are omitted.

One ends of the SSTs of the plurality of cell strings NS11, NS21, NS31, NS12, NS22, NS32, NS13, NS23, and NS33 may be connected to bit lines BL1, BL2, and BL3. For example, the SSTs SST11, SS21, and SST31 may be connected to the bit line BL1 extending in the second direction y. The structure of other SSTs connected to the other bit line BL2 or BL3 are similar to that described above, and thus a description thereof is omitted.

Memory cells corresponding to one string (or ground) select line and one word line may form one page. A write operation and a read operation may be performed in units of pages. Each of the memory cells of each page may store two or more bits. Bits written to memory cells of each page may form a logical page.

The memory cell array 20 may be provided as a three-dimensional memory array. The three-dimensional memory array may be monolithically formed at one or more physical levels of arrays of memory cells having active regions disposed on the substrate (not shown) and a circuit related to the operation of memory cells. The circuit related to the operation of memory cells may be disposed in or on the substrate. The monolithically formed three-dimensional memory array denotes that level layers of the three-dimensional array may be directly deposited on lower-level layers thereof. Alternatively, the circuit related to the operation of memory cells may be connected to a contact portion at the uppermost end in the third direction z.

FIG. 5 is a circuit diagram showing a cell string of a memory cell block and a part of a row decoder according to some exemplary embodiments of the present disclosure.

FIG. 5 shows connections between the single cell string NS11 of the memory cell array 20, the row decoder 33, and the control logic 37, but the illustrated connections may be applied to the other cell strings NS21, NS31, NS12, NS22, NS32, NS13, NS23, and NS33 in addition to the cell string NS11.

The row decoder 33 may include the first to tenth pass transistors 33_1 to 33_10. The number of pass transistors is related to the number of conductive layers which are stacked in a memory cell block of the memory cell array 20 and may vary according to the number of conductive layers stacked in the memory cell block.

In the cell string NS11, the GST GST11, the plurality of memory cells M11_1 to M11_8, and the SST SST11 may be sequentially connected in series from the common source line CSL to the bit line BL1.

The GST GST11, the plurality of memory cells M11_1 to M11_8, and the SST SST11 are connected to the first ground select line GSL1, the plurality of word lines WL1 to WL8, and the first string select line SSL1, respectively.

The first ground select line GSL1, the plurality of word lines WL1 to WL8, and the first string select line SSL1 may be connected to one ends of the first to tenth pass transistors 33_1 to 33_10, respectively.

Gates of the first to tenth pass transistors 33_1 to 33_10 may be electrically separated from each other, and ends of the first to tenth pass transistors 33_1 to 33_10, which are not the one ends, are not electrically shared with each other.

The control logic 37 may include first to tenth operation control transistors OTr1 to OTr10 and first to tenth discharge transistors DTr1 to DTr10. The first to tenth operation control transistors OTr1 to OTr10 and the first to tenth discharge transistors DTr1 to DTr10 may be respectively connected to the sources/drains of the first to tenth pass transistors 33_1 to 33_10 and operate as control transistors which control an operating voltage provided to the first ground select line GSL1, the plurality of word lines WL1 to WL8, and the first string select line SSL1.

One ends of the first to tenth operation control transistors OTr1 to OTr10 are connected to the other ends of the first to tenth pass transistors 33_1 to 33_10 and provide an operating voltage. The other ends of the first to tenth operation control transistors OTr1 to OTr10 are connected to the voltage generator 38 and provide an operating voltage generated by the voltage generator 38 to the first to tenth pass transistors 33_1 to 33_10. The first to tenth operation control transistors OTr1 to OTr10 may control the operating voltage through first to tenth operation control gate signals OG1 to OG10, respectively.

One ends of the first to tenth discharge transistors DTr1 to DTr10 may be respectively connected to the other ends of the first to tenth pass transistors 33_1 to 33_10 and perform a discharge operation for the operating voltage of the first ground select line GSL1, the plurality of word lines WL1 to WL8, and the first string select line SSL1. The other ends of the first to tenth discharge transistors DTr1 to DTr10 are grounded and perform a discharge operation for the operating voltage. The first to tenth discharge transistors DTr1 to DTr10 may perform a discharge operation for the operating voltage through first to tenth discharge gate signals DG1 to DG10, respectively.

Figure 6:
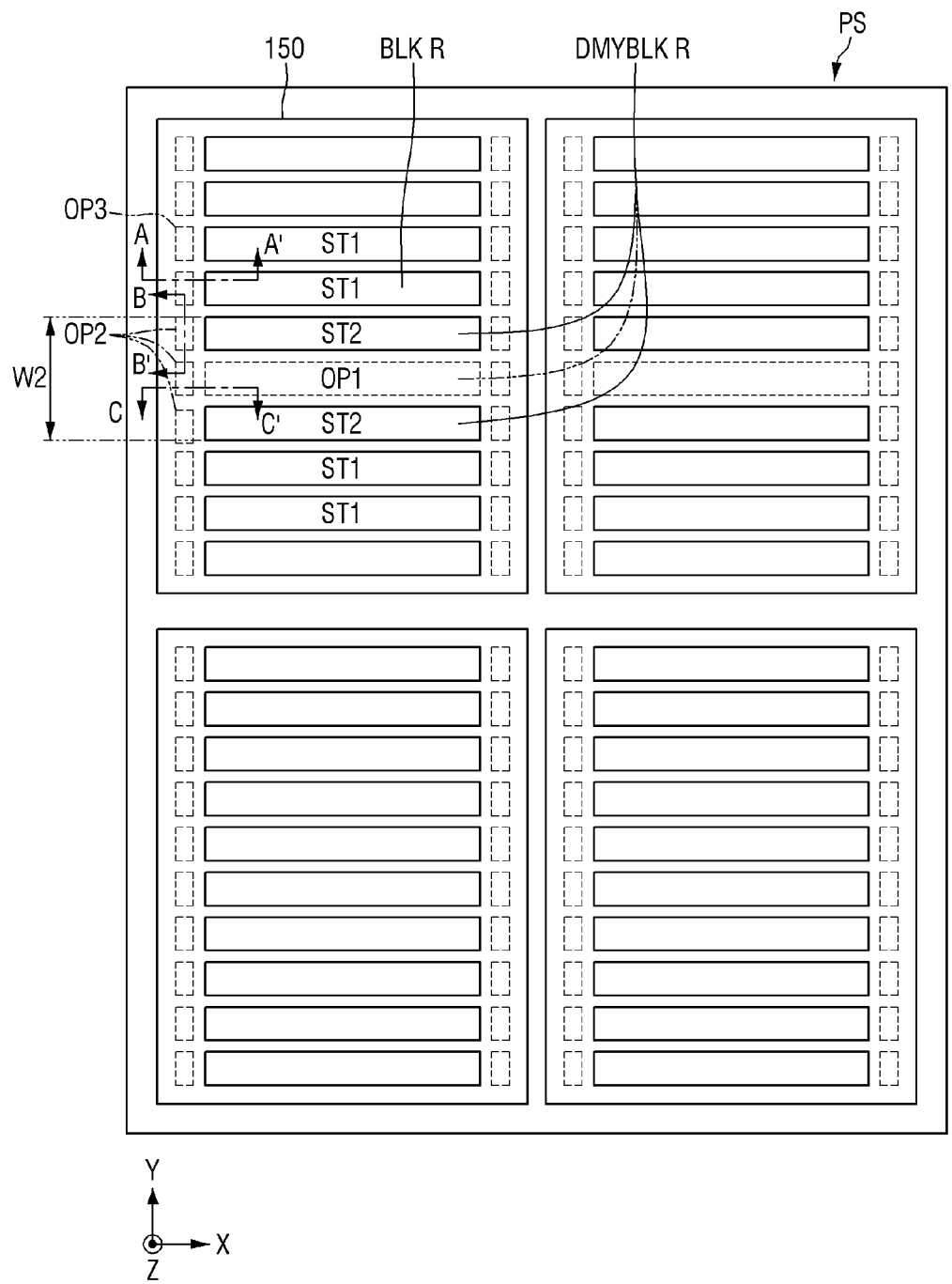
FIG. 6 is a layout diagram illustrating a nonvolatile memory device according to some exemplary embodiments of the present disclosure.
Figure 7:
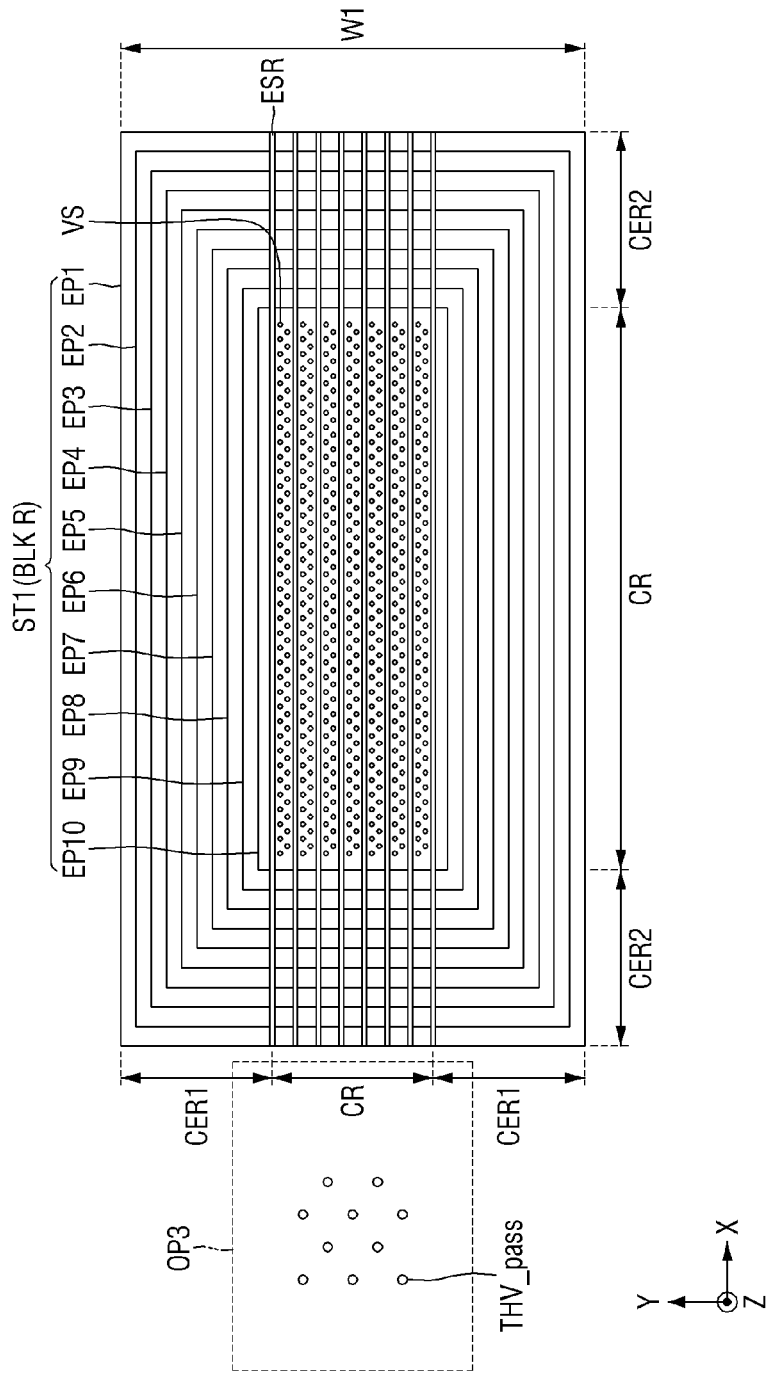
FIG. 7 is a plan view showing one of a plurality of stacked structures (block regions) and an adjacent opening of FIG. 6.
Figure 8:
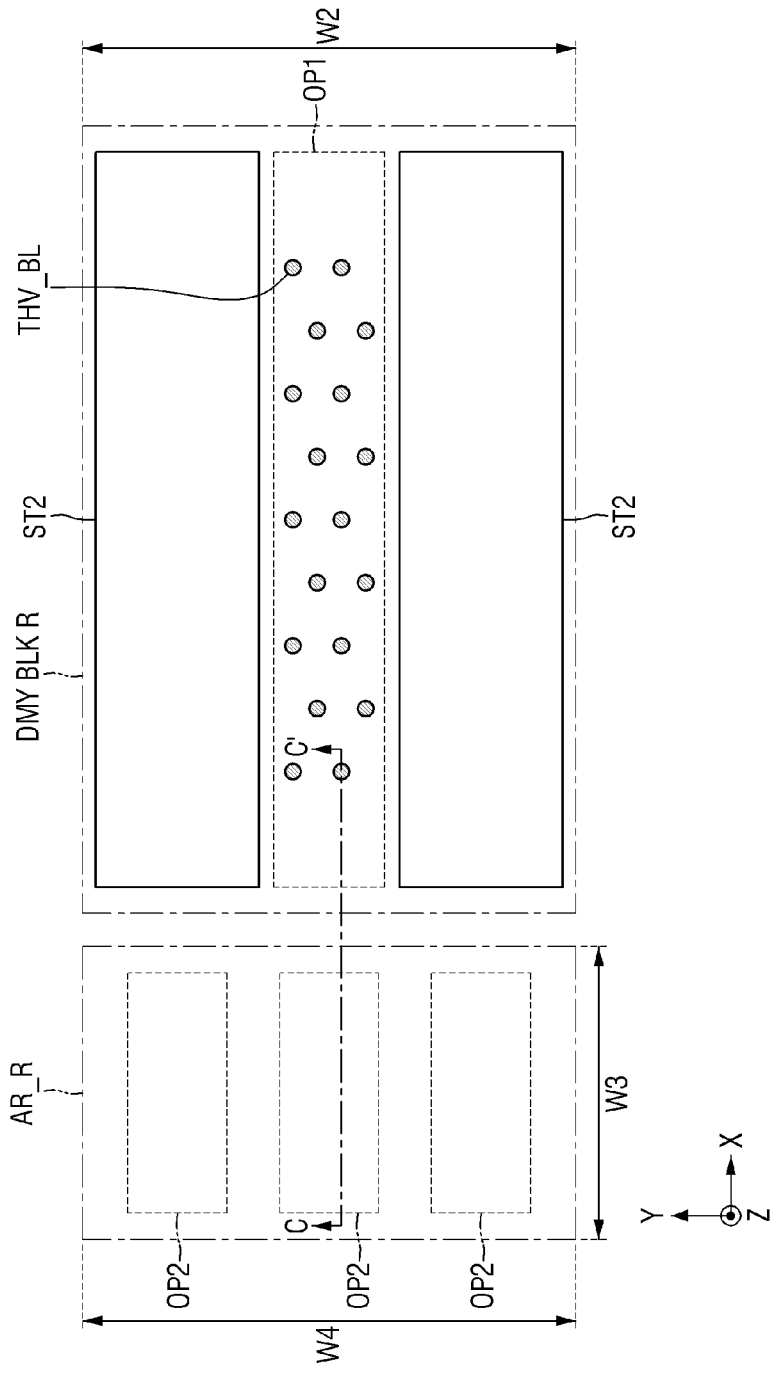
FIG. 8 is a plan view showing a dummy block region and adjacent openings of FIG. 6.
Figure 9:
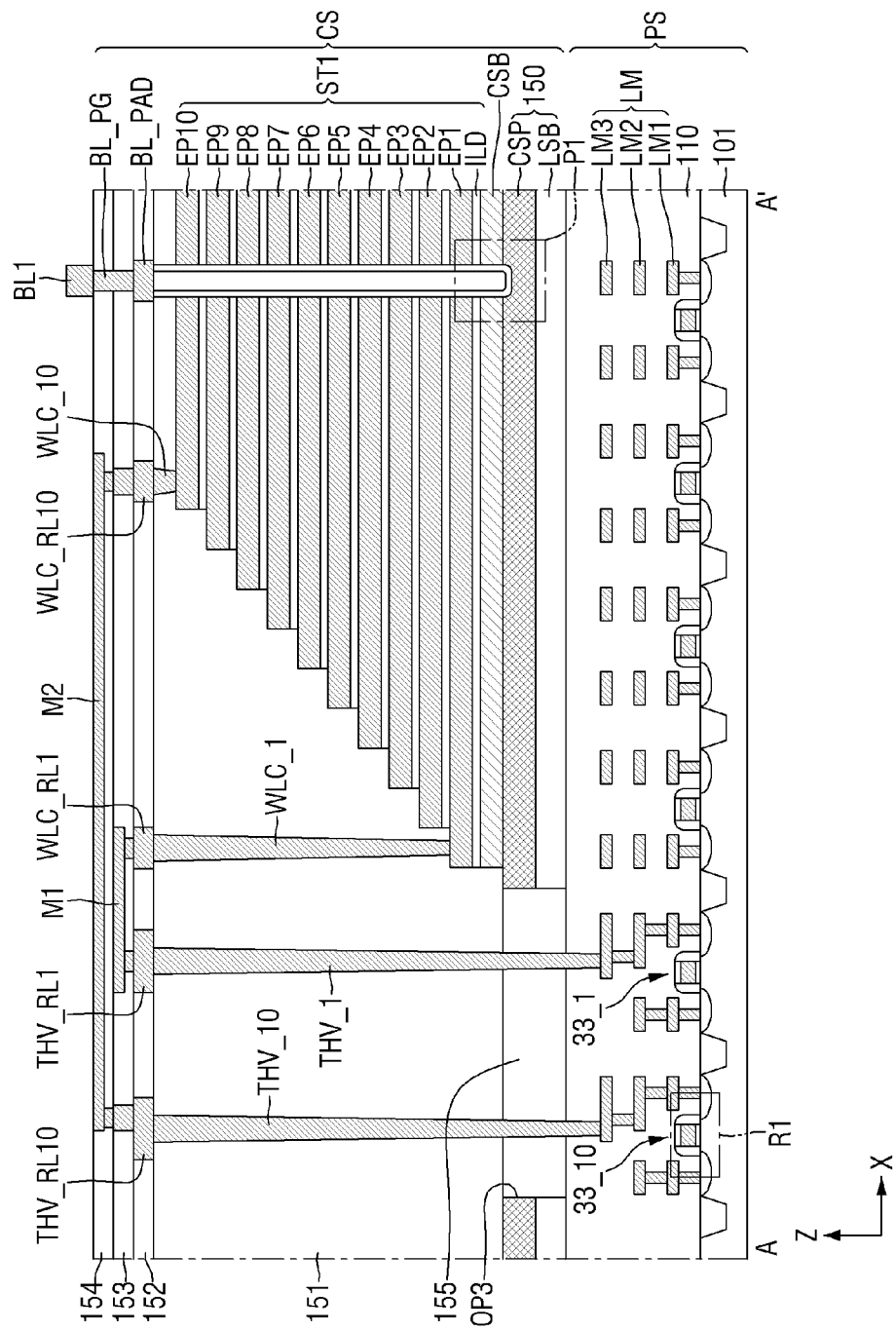
FIG. 9 is a cross-sectional view taken along line A-A' of FIG. 6.
Figure 10:
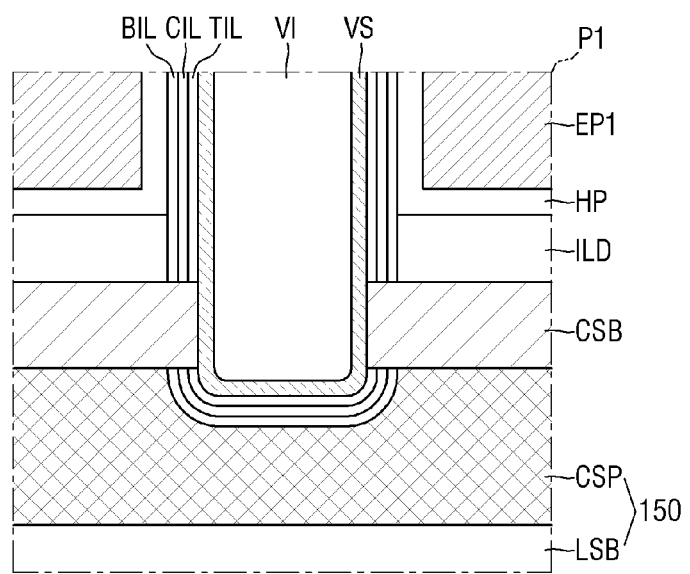
FIG. 10 is an enlarged view of a region P1 of FIG. 9.
Figure 11:
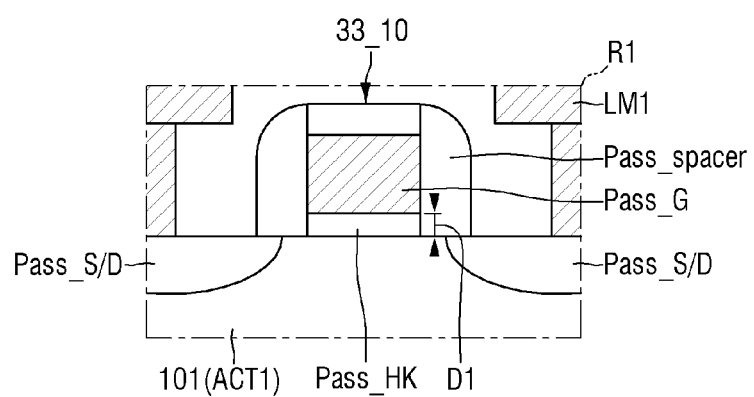
FIG. 11 is an enlarged view of a region R1 of FIG. 9.
Figure 12:
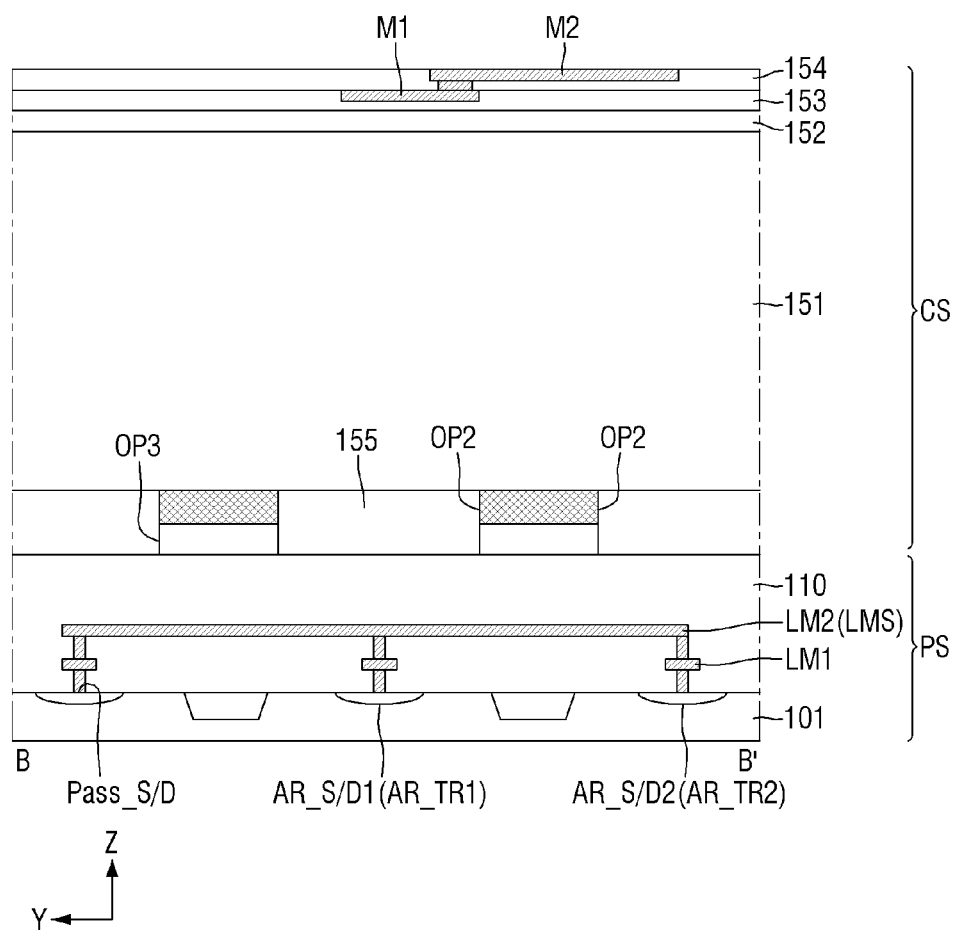
FIG. 12 is a cross-sectional view taken along line B-B' of FIG. 6.
Figure 13:
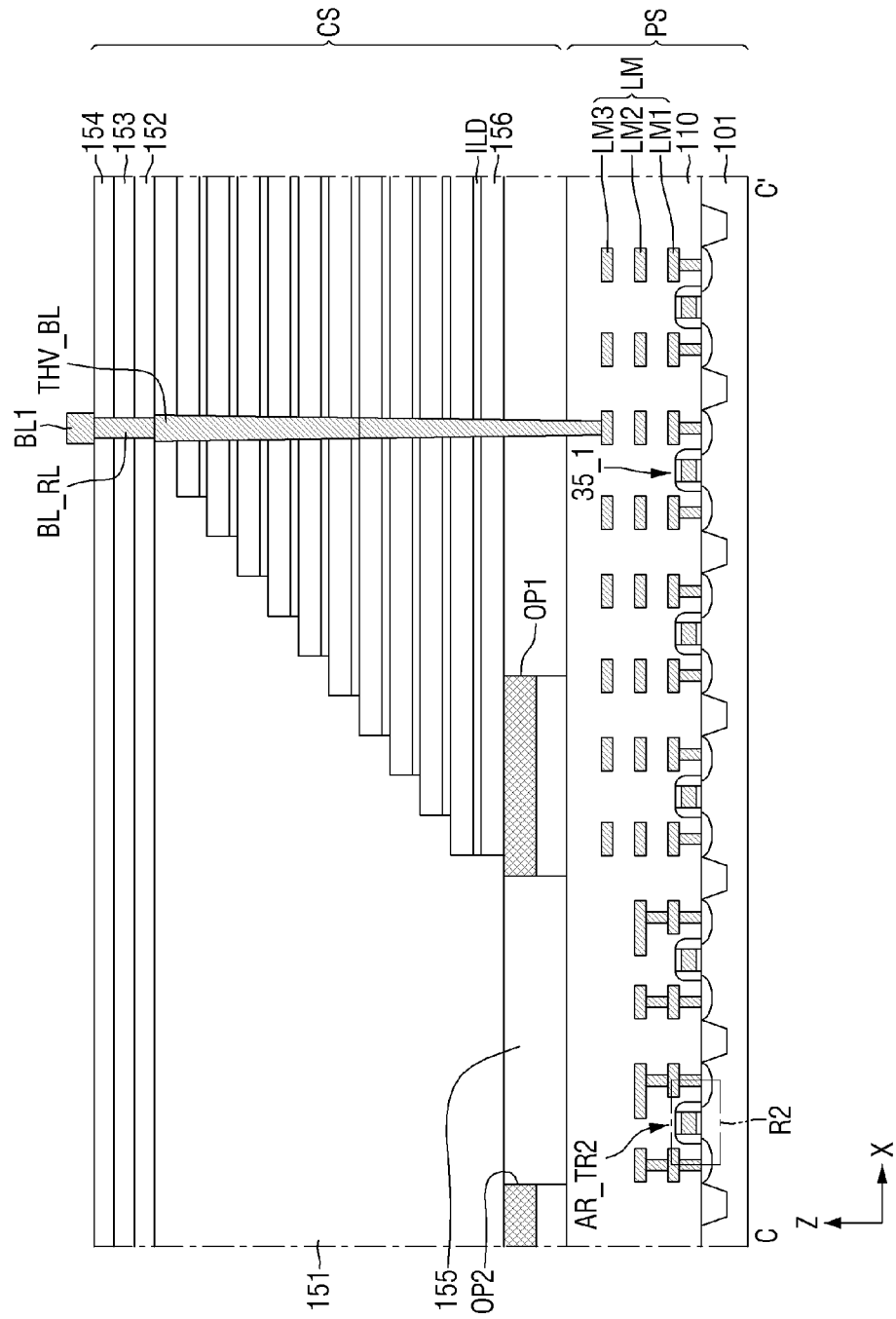
FIG. 13 is a cross-sectional view taken along line C-C' of FIG. 6.
Figure 14:
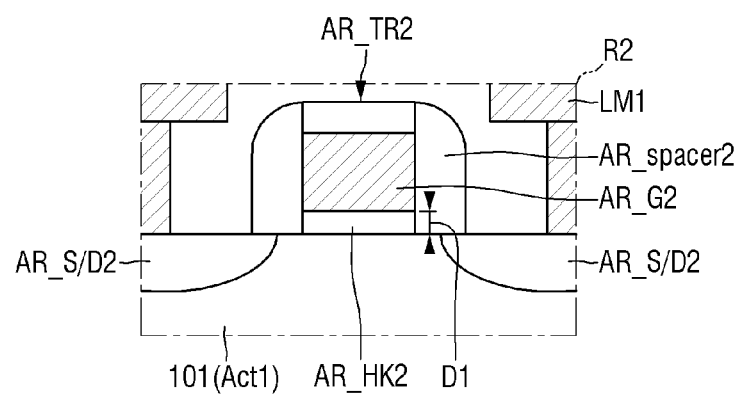
FIG. 14 is an enlarged view of a region R2 of FIG. 13.

FIG. 6 is a layout diagram illustrating a nonvolatile memory device according to some exemplary embodiments of the present disclosure. FIG. 7 is a plan view showing one of a plurality of stacked structures (block regions) and an adjacent opening of FIG. 6. FIG. 8 is a plan view showing a dummy block region and adjacent openings of FIG. 6. FIG. 9 is a cross-sectional view taken along line A-A' of FIG. 6. FIG. 10 is an enlarged view of a region P1 of FIG. 9. FIG. 11 is an enlarged view of a region R1 of FIG. 9. FIG. 12 is a cross-sectional view taken along line B-B' of FIG. 6. FIG. 13 is a cross-sectional view taken along line C-C' of FIG. 6. FIG. 14 is an enlarged view of a region R2 of FIG. 13.

Referring to FIGS. 6 to 14, the nonvolatile memory 10 may include the peripheral logic structure PS and the cell array structure CS.

The peripheral logic structure PS may include the plurality of pass transistors 33_1 to 33_10, active residual region transistors AR_TR1 and AR_TR2, a page buffer transistor 35_1, and a lower interconnection LM.

The plurality of pass transistors 33_1 to 33_10, the active residual region transistors AR_TR1 and AR_TR2, and the page buffer transistor 35_1 may be formed on a substrate 101. The plurality of pass transistors 33_1 to 33_10 may be included in the row decoder 33 of FIG. 2, the active residual region transistors AR_TR1 and AR_TR2 may be included in the control logic 37 of FIG. 2, and the page buffer transistor 35_1 may be included in the page buffer 35 of FIG. 2.

A configuration and arrangement of the plurality of pass transistors 33_1 to 33_10, the active residual region transistors AR_TR1 and AR_TR2, and the page buffer transistor 35_1 are described in detail with reference to a horizontal semiconductor layer 150.

The substrate 101 may be bulk silicon or a silicon-on-insulator (SOI). Alternatively, the substrate 101 may be a silicon substrate or may include another material, such as silicon-germanium, silicon germanium on insulator (SGOI), indium antimonide, lead telluride, indium arsenide, indium phosphide, gallium arsenide, or gallium antimonide, but is not limited thereto.

A peripheral logic insulating film 110 may be formed on the substrate 101. The peripheral logic insulating film 110 may include or may be formed of at least one of, for example, silicon oxide, silicon nitride, and silicon oxynitride.

The lower interconnection LM may be formed in the peripheral logic insulating film 110. The lower interconnection LM may include first to third lower interconnections LM1 to LM3. However, the number of interconnections is exemplary, and the present disclosure is not limited thereto. The lower interconnection LM may be connected to the plurality of pass transistors 33_1 to 33_10, the active residual region transistors AR_TR1 and AR_TR2, and the page buffer transistor 35_1 and may be connected to first to tenth through-hole vias THV_1 to THV_10, a bit line-through hole via THV_BL, and the like.

The cell array structure CS may include a plurality of horizontal semiconductor layers 150 on the peripheral logic structure PS, and a plurality of block regions BLK R and dummy block regions DMY BLK R on each of the horizontal semiconductor layers 150.

The plurality of horizontal semiconductor layers 150 may be disposed on the peripheral logic structure PS. Each of the horizontal semiconductor layers 150 may extend along an upper surface of the peripheral logic structure PS.

Each of the horizontal semiconductor layers 150 may include a plurality of first openings OP1, a plurality of second openings OP2, and a plurality of third openings OP3. The plurality of first openings OP1, the plurality of second openings OP2, and the plurality of third openings OP3 may expose parts of the peripheral logic structure PS.

The plurality of first openings OP1 may be disposed in the dummy block regions DMY BLK R between the plurality of block regions BLK R arranged in the second direction y. For example, the plurality of first openings OP1 may be disposed between second stacked structures ST2 which are included in the dummy block regions DMY BLK R and arranged in the second direction y.

The plurality of second openings OP2 are arranged away or spaced apart from the dummy block regions DMY BLK R in the first direction x and arranged in one line in the second direction y. The plurality of second openings OP2 arranged in one line constitute an active residual region AR_R. The second openings OP2 are arranged away from the first opening OP1 in the first direction x or away from the second stacked structures ST2 in the first direction x. The active residual region AR_R has a third width W3 in the first direction x, and the third width W3 is within a range from 150 nm to 400 nm. The active residual region AR_R has a fourth width W4 in the second direction y, and the fourth width W4 is within a range from 10 nm to 100 nm.

The plurality of third openings OP3 are arranged away from the block regions BLK R in the first direction x and arranged in one line in the second direction y. The third openings OP3 are arranged in one line in the second direction with respect to the second openings OP2.

Each of the horizontal semiconductor layers 150 may include a lower support semiconductor layer LSB and a common source plate CSP on the lower support semiconductor layer LSB. The horizontal semiconductor layer 150 may include or may be formed of at least one of, for example, silicon (Si), germanium (Ge), silicon germanium (SiGe), gallium arsenide (GaAs), indium gallium arsenide (InGaAs), aluminum gallium arsenide (AlGaAs), and a compound thereof. The horizontal semiconductor layer 150 may have a crystal structure including or being at least one selected from among a monocrystalline semiconductor, an amorphous semiconductor, and a polycrystalline semiconductor.

The common source plate CSP may serve as the common source line CSL of FIG. 4.

The present invention is not limited thereto. For example, unlike the drawings, the entirety of each of the horizontal semiconductor layers 150 may be the common source plate CSP without the lower support semiconductor layer LSB.

The present inventive concept is not limited thereto. For example, unlike the drawings, a common source line rather than a planar common source plate in two dimensions may be formed to extend long in the first direction x in the horizontal semiconductor layer 150.

A filling insulating film 155 may be formed on the peripheral logic structure PS. The first openings OP1, the second openings OP2, and the third openings OP3 may be filled with the filling insulating film 155. The filling insulating film 155 may include or may be formed of, for example, silicon oxide but is not limited thereto.

The plurality of pass transistors 33_1 to 33_10 may be disposed to overlap the plurality of third openings OP3 in a plan view. Among the plurality of pass transistors 33_1 to 33_10, the tenth pass transistor 33_10 may correspond to one of the first to tenth pass transistors 33_1 to 33_10 of FIG. 5, and it is self-evident that a configuration and arrangement of pass transistors in the nonvolatile memory 10 may be described with reference to the tenth pass transistor 33_10.

The tenth pass transistor 33_10 may include a gate electrode Pass_G, a spacer Pass_spacer, a high-k film Pass_HK, and source/drains Pass S/D.

The tenth pass transistor 33_10 may be disposed at a first active region ACT1 of the substrate 101. The high-k film Pass_HK and the gate electrode Pass_G may be sequentially disposed on the first active region ACT1, and the spacer Pass_spacer may be disposed on sidewalls of the high-k film Pass_HK and the gate electrode Pass_G.

The tenth pass transistor 33_10 transmits an operating voltage applied to a conductive film, and the operating voltage includes an erase voltage which is a high voltage.

Accordingly, the tenth pass transistor 33_10 is a high-voltage transistor. The high-k film Pass-HK includes or is formed of silicon oxide or a high-k insulating film, and a first thickness D1 of the high-k film Pass_HK is within a range from 10 nm to 50 nm.

A voltage applied to the gate electrode Pass_G is within a range from −5 V to 30 V, and the voltage level is within a range from 0 V to 30 V. A voltage applied to one of the source/drains Pass S/D is within a range from −5 V to 30 V, and the voltage level is within a range from 0 V to 30 V.

The source/drain Pass S/D may be connected to the tenth through-hole via THV_10 among through-pass-hole vias THV_pass passing through the filling insulating film 155 within the third openings OP3, and the source/drain Pass S/D may be electrically connected to a tenth conductive film EP10 through the tenth through-hole via THV_10, a tenth through-via interconnection THV_RL10, a first upper interconnection M1, a second upper interconnection M2, a tenth word line contact interconnection WLC_RL10, and a tenth word line contact WLC_10.

The tenth through-hole via THV_10 may pass through a first interlayer insulating film 151 and the filling insulating film 155, and the tenth word line contact WLC_10 may pass through the first interlayer insulating film 151. A second interlayer insulating film 152 may include the tenth through-via interconnection THV_RL10 and the tenth word line contact interconnection WLC_RL10, a third interlayer insulating film 153 may include the first upper interconnection M1, and a fourth interlayer insulating film 154 may include the second upper interconnection M2.

The other source/drain Pass S/D may be electrically connected to source/drains AR_SD1 and AR_SD2 of the active residual region transistors AR_TR1 and AR_TR2, which will be described below, through a lower interconnection structure LMS which does not pass through the upper surface of the peripheral logic structure PS. For example, the other source/drain Pass S/D may be electrically connected to source/drains AR_SD1 and AR_SD2 of the active residual region transistors AR_TR1 and AR_TR2 through the lower interconnection structure LMS which is disposed below an upper surface of the peripheral logic structure PS.

The active residual region transistors AR_TR1 and AR_TR2 may be disposed to overlap the plurality of second openings OP2 in a plan view. For example, the active residual region transistors AR_TR1 and AR_TR2 may be disposed to overlap the active residual region AR_R in a plan view. The active residual region transistors AR_TR1 and AR_TR2 may correspond to one of the first to tenth operation control transistors OTr1 to OTr10 and one of the first to tenth discharge transistors DTr1 to DTr10, respectively. For example, the first active residual region transistor AR_TR1 may correspond to the tenth operation control transistor OTr10, and the second active residual region transistor AR_TR2 may correspond to the tenth discharge transistor DTr10.

It is self-evident that a configuration and arrangement of operation control transistors and discharge transistors in the nonvolatile memory 10 of the present disclosure may be described with reference to the second active residual region transistor AR_TR2.

The second active residual region transistor AR_TR2 may include a gate electrode AR_G2, a spacer AR_spacer2, a high-k film AR_HK2, and a source/drain AR_S/D2.

The second active residual region transistor AR_TR2 is adjacent to the tenth pass transistor 33_10 and thus may be disposed at the first active region ACT1 in which the tenth pass transistor 33_10 is disposed. On the first active region ACT1, the high-k film AR_HK2 and the gate electrode AR_G2 may be sequentially disposed, and the spacer AR_spacer2 may be disposed on sidewalls of the high-k film AR_HK2 and the gate electrode AR_G2.

The second active residual region transistor AR_TR2 discharges an operating voltage applied to a conductive film, and the operating voltage includes an erase voltage which is a high voltage. Accordingly, the second active residual region transistor AR_TR2 is a high-voltage transistor, and the high-k film R_HK2 includes or is formed of silicon oxide or a high-k insulating film.

A first thickness D1 of the high-k film AR_HK2 is identical to the first thickness D1 of the high-k film Pass_HK of the tenth pass transistor 33_10 and is within a range from 10 nm to 50 nm.

A voltage applied to the gate electrode AR_G2 is within a range from −5 V to 30 V, and the voltage level is within a range from 0 V to 30 V. A voltage applied to the source/drain AR_S/D2 is within a range from −5 V to 30 V, and the voltage level is within a range from 0 V to 30 V.

The source/drain AR_S/D2 may be connected to the source/drain AR_S/D1 of the first active residual region transistor AR_TR1 and the source/drain Pass S/D of the tenth pass transistor 33_10 through the lower interconnection structure LMS which does not pass through the upper surface of the peripheral logic structure PS.

The page buffer transistor 35_1 may be disposed to overlap the plurality of first openings OP1 in a plan view. Accordingly, the bit line-through hole via THV_BL, which connects the first bit line BL1 extending along the upper surface of the cell array structure CS to the lower interconnection LM connected to the page buffer transistor 35_1, may pass through the filling insulating film 155 within the first opening OP1.

The bit line-through hole via THV_BL and the first bit line BL1 may be connected through a via connection BL_RL which is an upper interconnection. The bit line-through hole via THV_BL may pass through the first interlayer insulating film 151, sacrificial insulating films 156, and interlayer insulating films ILD disposed between the first bit line BL1 and the lower interconnection LM.

On each of the horizontal semiconductor layers 150, the plurality of block regions BLK R and the dummy block regions DMY BLK R may be disposed in one line in the second direction y. The plurality of block regions BLK R may include first stacked structures ST1, and the dummy block region DMY BLK R may include the first opening OP1 and the second stacked structures ST2 adjacent to the first opening OP1.

In FIG. 6, nine stacked structures ST1 and ST2 and one first opening OP1 are disposed on each of the horizontal semiconductor layers 150. However, this is only for convenience of description, and the number of stacked structures and the number of first openings are not limited thereto. In a semiconductor device according to some exemplary embodiments, two or more stacked structures ST1 and ST2 may be arranged on each of the horizontal semiconductor layers 150.

The nonvolatile memory 10 of the present disclosure will be described below, focusing on the first stacked structures ST1. It is self-evident that a configuration and structure of the first stacked structures ST1 may be applied to the second stacked structures ST2.

In FIGS. 7, 9, and 10, the first stacked structure ST1 may include a plurality of conductive films EP1, EP2, EP3, EP4, EP5, EP6, EP7, EP8, EP9, and EP10 stacked in the third direction z. The first stacked structure ST1 may include the interlayer insulating films ILD disposed between the plurality of conductive films EP1, EP2, EP3, EP4, EP5, EP6, EP7, EP8, EP9, and EP10. The first stacked structure ST1 is shown to include the ten conductive films. However, this is only for convenience of description, and the number of conductive films is not limited thereto.

The plurality of conductive films EP1, EP2, EP3, EP4, EP5, EP6, EP7, EP8, EP9, and EP10 stacked in the third direction z may include gate electrodes included in the SST SST11 and the GST GST11 described in FIG. 4. The plurality of conductive films EP1, EP2, EP3, EP4, EP5, EP6, EP7, EP8, EP9, and EP10 stacked in the third direction z may include word lines of the memory cells M11_1 to M11_8.

For example, the first stacked structure ST1 may include the fourth conductive film EP4 and the fifth conductive film EP5 which are adjacent in the third direction z. The fifth conductive film EP5 may be disposed on the fourth conductive film EP4.

The fourth conductive film EP4 may partially protrude from the fifth conductive film EP5 in the first direction x and the second direction y. Accordingly, the first stacked structure ST1 may include a step structure (e.g., a stepped side surface) in the first direction x and the second direction y.

The first stacked structure ST1 may include a cell region CR and first cell extension regions CER1 which extend from the cell region CR in the second direction y. The first stacked structure ST1 may include second extension regions CER2 which extend from the cell region CR in the first direction x.

A plurality of electrode separation regions ESR may be disposed in the first stacked structure ST1. Each of the electrode separation regions may extend in the first direction x.

The first stacked structure ST1 may include a plurality of electrode separation trenches. The electrode separation trenches may each be filled with the electrode separation regions ESR.

For example, each of the electrode separation regions ESR may include or may be formed of an insulating material which fills the electrode separation trenches. The electrode separation regions ESR may include or may be formed of, for example, silicon oxide.

In some embodiments, unlike the drawings, the electrode separation region ESR may include a liner formed along a sidewall of the electrode separation trench EST and a filling film which fills the electrode separation trench on the liner. For example, the liner may include or may be formed of an insulating material, and the filling film may include or may be formed of a conductive material. In some embodiments, the liner may include or may be formed of a conductive material, and the filling film may include or may be formed of an insulating material.

Each of the electrode separation regions ESR may separate the cell region CR in the second direction y. The electrode separation regions ESR may not be disposed in the first cell extension regions CER1. The electrode separation regions ESR are used in a replacement process of forming the word lines WL (see FIG. 4). For example, the electrode separation trenches for forming the electrode separation regions ESR are used to remove parts of a mold film, and word lines are formed at positions of the removed parts of the mold film.

When the mold film is removed using the electrode separation trenches, the entire mold film in the first cell extension regions CER1 is not removed. Accordingly, parts of the mold film may remain in the first cell extension region CER1. The first cell extension regions CER1 include mold regions extending in the first direction x.

In the nonvolatile memory device according to some exemplary embodiments, each of the conductive films EP1, EP2, EP3, EP4, EP5, EP6, EP7, EP8, EP9, and EP10 may include an electrode region and a first mold region. The electrode region EP_E may include or may be formed of, for example, tungsten (W) but is not limited thereto.

The electrode region may be divided by the plurality of electrode separation regions ESR extending in the first direction x. The mold region may extend in the second direction y from the electrode region.

The plurality of electrode separation regions ESR may include the first electrode separation region and the second electrode separation region which are farthest apart from each other in the second direction. Here, the electrode region may be disposed between the first electrode separation region and the second electrode separation region. A part of the electrode region may be disposed in a region other than between the first electrode separation region and the second electrode separation region.

Between the adjacent electrode separation regions ESR, a plurality of vertical structures VS passing through the first stacked structure ST1 may be disposed. Each of the vertical structures VS may be connected to the horizontal semiconductor layer 150. For example, a plurality of channel holes may pass through the first stacked structure ST1, and the plurality of vertical structures VS having channel structures may be formed in the channel holes.

For example, some of the vertical structures VS (i.e., channel structures) used as channel regions of the memory cells may be connected to the common source plate CPS included in the horizontal semiconductor layer 150.

The vertical structures VS may include or may be formed of a semiconductor material such as silicon (Si), germanium (Ga), or a compound thereof. Alternatively, the vertical structures VS may include or may be formed of a metal oxide semiconductor material.

A blocking insulating film BIL, a charge storage film CIL, and a tunnel insulating film TIL may be sequentially disposed between the vertical structures VS and the first stacked structure ST1. However, the blocking insulating film BIL, the charge storage film CIL, and the tunnel insulating film TIL disposed between the vertical structures VS and the first stacked structure ST1 are only exemplary, and films disposed between the vertical structures VS and the first stacked structure ST1 are not limited thereto.

Vertical insulating films VI may be disposed on the vertical structures VS. The vertical insulating films VI may fill spaces defined by the vertical structures VS. A horizontal insulating pattern HP may be disposed between the first conductive film EP1 and the interlayer insulating film ILD and between the first conductive film EP1 and the blocking insulating film BIL. The horizontal insulating pattern HP may include or may be formed of, for example, silicon oxide or a high-k insulating film.

The blocking insulating film BIL, the charge storage film CIL, and the tunnel insulating film TIL may be divided at lower portions of the vertical structures VS. A contact support film CSB may be disposed between the divided blocking insulating films BIL, charge storage films CIL, and tunnel insulating films TIL. The contact support film CSB may electrically connect the common source plate CSP to the vertical structures VS. The contact support film CSB may include or may be formed of a semiconductor material such as silicon (Si), germanium (Ga), or a compound thereof.

The first interlayer insulating film 151 may be formed on the horizontal semiconductor layer 150. The first interlayer insulating film 151 may cover the first stacked structures ST1 and the second stacked structures ST2. The first interlayer insulating film 151 may include or may be formed of, for example, silicon oxide but is not limited thereto.

The second interlayer insulating film 152, the third interlayer insulating film 153, and the fourth interlayer insulating film 154 may be sequentially formed on the first interlayer insulating film 151. Some of the electrode separation regions ESR may extend to the second interlayer insulating film 152.

The bit lines BL may be disposed on the first stacked structure ST1. The bit lines BL may extend lengthwise in the second direction y. The bit lines BL may extend in the second direction y to be electrically connected to at least one of the plurality of vertical structures VS.

The first bit line BL1 may be formed on the fourth interlayer insulating film 154. The first bit line BL1 may be electrically connected to the vertical structures VS through a bit line pad BL_PAD and a bit line plug BL_PG.

The sacrificial insulating film 156 may be disposed on the filling insulating film 155 between the second stacked structures ST2 as shown in FIG. 13. For example, the sacrificial insulating film 156 may be disposed on the filling insulating film 155 within the first opening OP1. The sacrificial insulating film 156 may be removed and replaced with tungsten (W) or the like through the replacement process of forming the word lines WL (see FIG. 4), but the replacement process is not performed on the first opening OP1 because the first opening OP1 is in the dummy block region DMY BLK R. For example, the sacrificial insulating film 156 may include or may be formed of silicon nitride but is not limited thereto. For example, the sacrificial insulating film 156 may remain after the replacement process of forming the word lines WL.

The dummy block region DMY BLK R includes the first opening OP1 and the second stacked structures ST2 adjacent to the first opening OP1, and the first opening OP1 and the second stacked structures ST2 adjacent to the first opening OP1 are disposed in one line in the second direction y. Accordingly, a second width W2 of the dummy block region DMY BLK R in the second direction y is within a range from two times to four times a first width W1 of the block regions BLK R in the second direction y.

Figure 15:
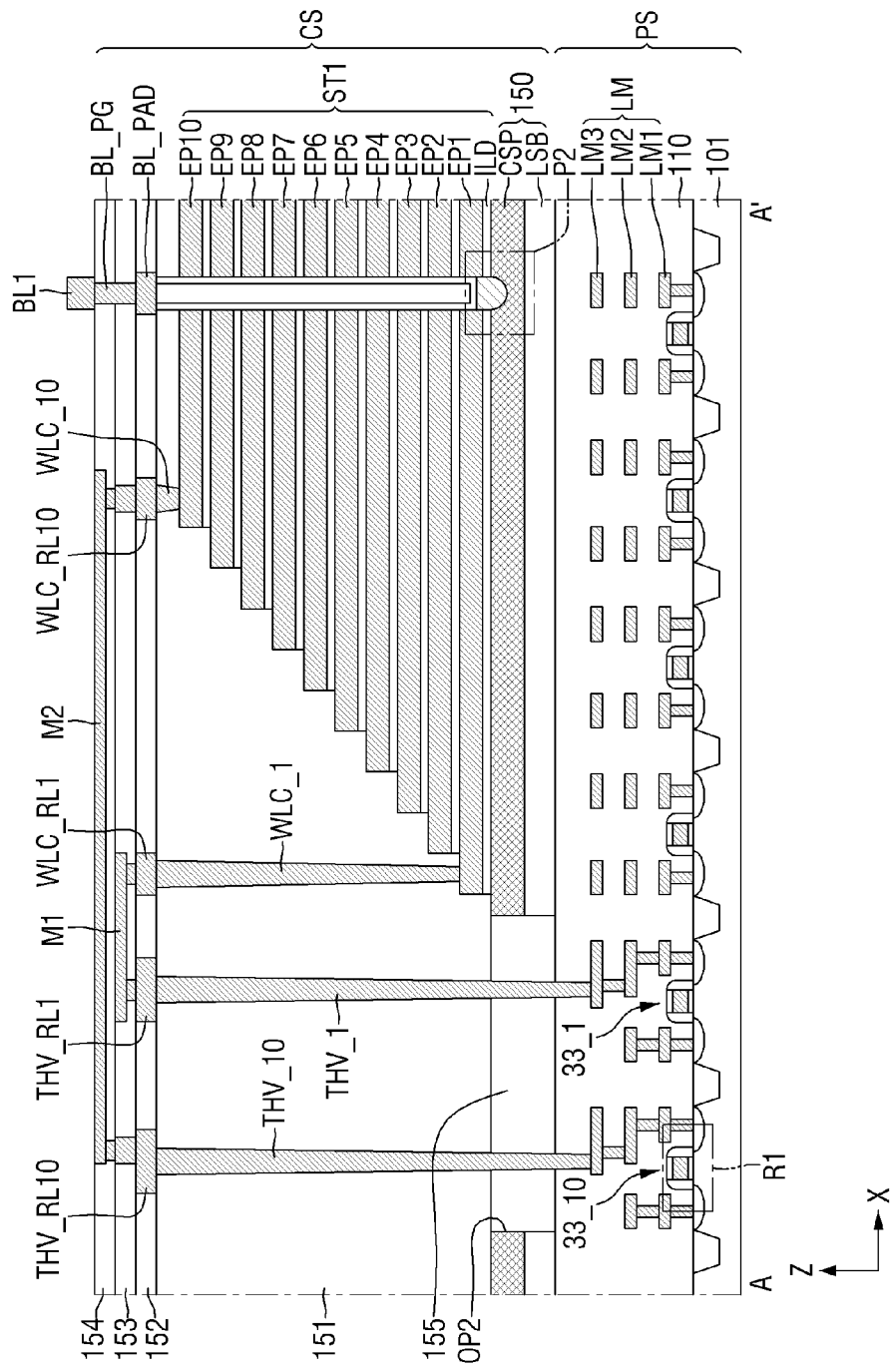
FIGS. 15 and 16 are diagrams illustrating a nonvolatile memory device according to some exemplary embodiments of the present disclosure.
Figure 16:
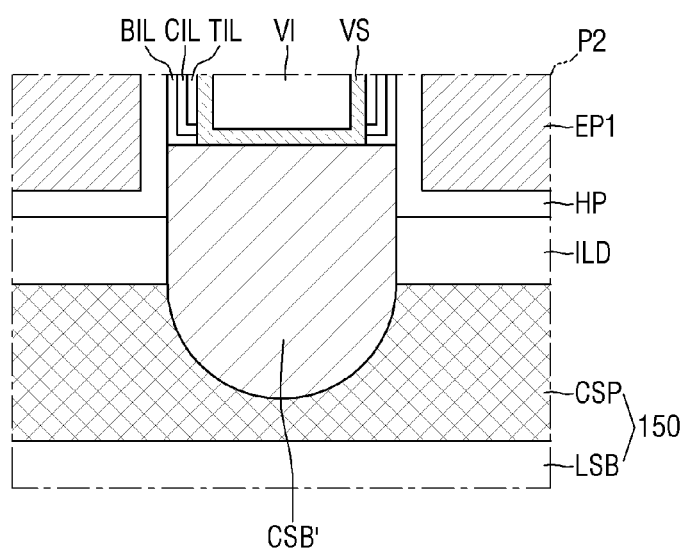

FIGS. 15 and 16 are diagrams illustrating a nonvolatile memory device according to some exemplary embodiments of the present disclosure.

A nonvolatile memory device according to some exemplary embodiments of the present disclosure will be described below with reference to FIGS. 15 and 16. The nonvolatile memory device will be described, focusing on differences with the nonvolatile memory device shown in FIGS. 9 to 14. FIG. 16 is an enlarged view of a region P2 of FIG. 15.

Unlike the region P1 of FIG. 10, in the region P2, a blocking insulating film BIL, a charge storage film CIL, and a tunnel insulating film TIL may be divided at the bottom of vertical structures VS. In some exemplary embodiments, a contact support film CSB' may be buried in a common source plate CSP. The contact support film CSB' may be formed in a process of selective epitaxial growth (SEG) from the common source plate CSP. A channel structure in the vertical structure VS may pass through a part of an information storage film and contact an upper surface of the contact support film CSB'.

Figure 17:
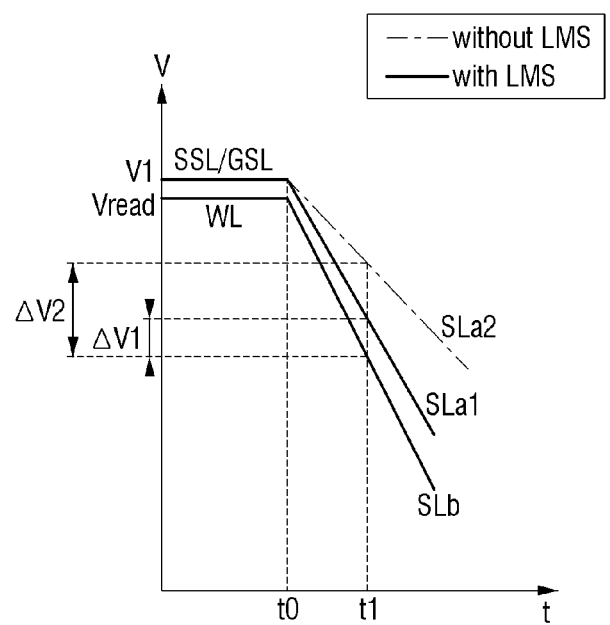
FIG. 17 is a graph illustrating effects of the nonvolatile memory device according to some exemplary embodiments of the present disclosure.
Figure 18:
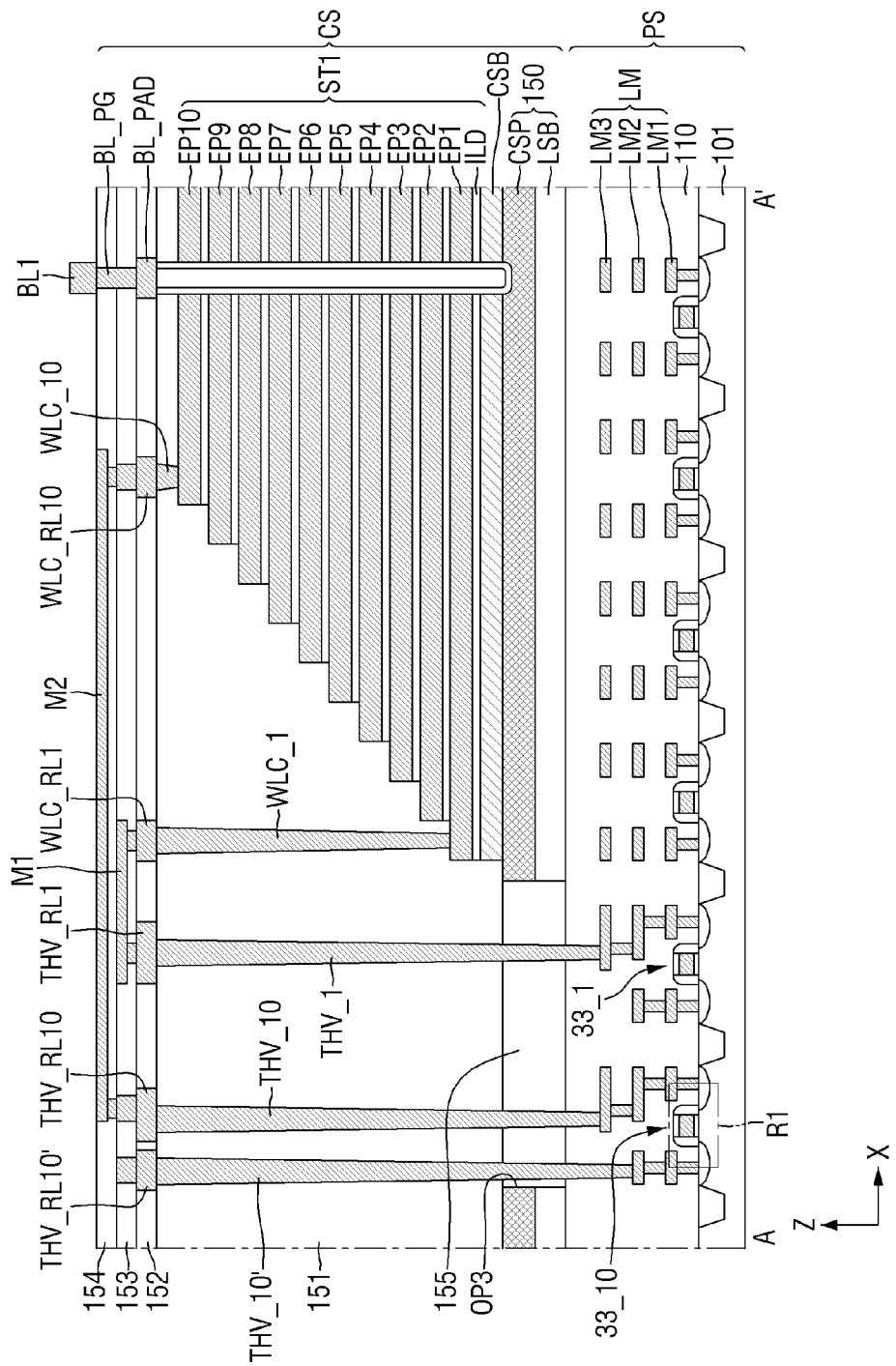
FIGS. 18 to 21 are diagrams illustrating a nonvolatile memory device according to some exemplary embodiments of the present disclosure.
Figure 19:
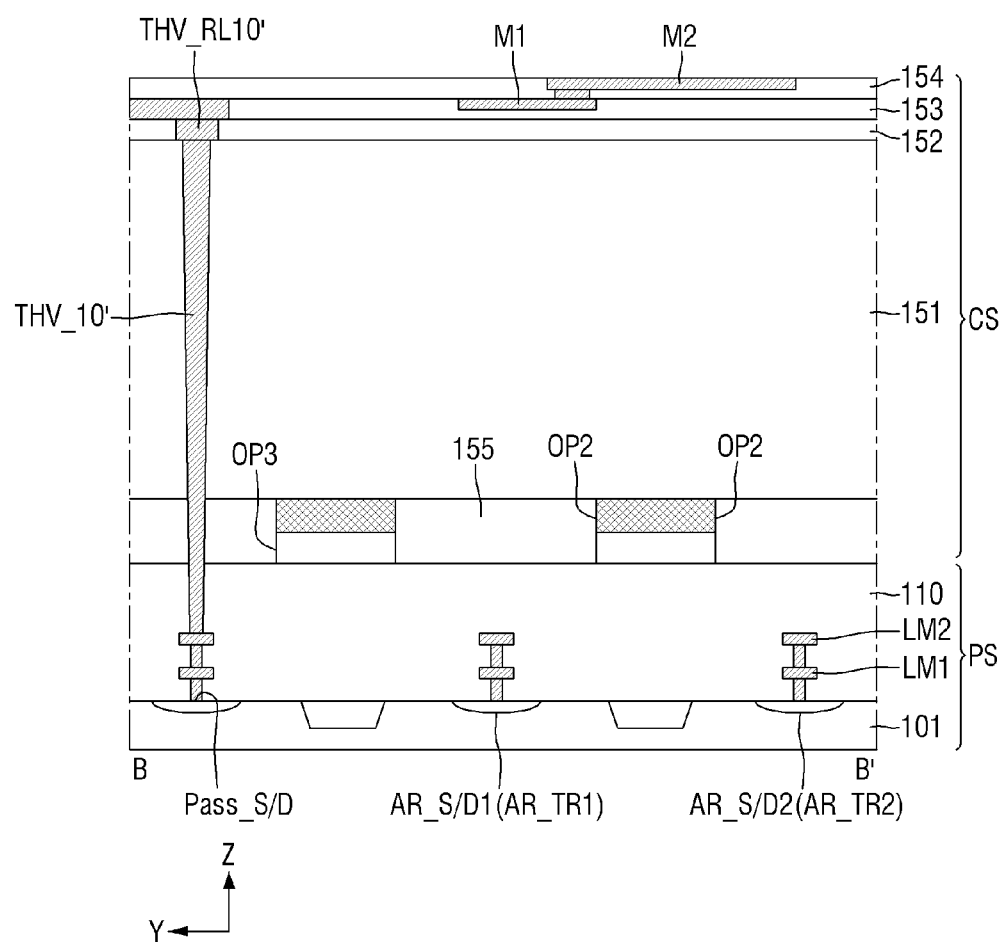
Figure 20:
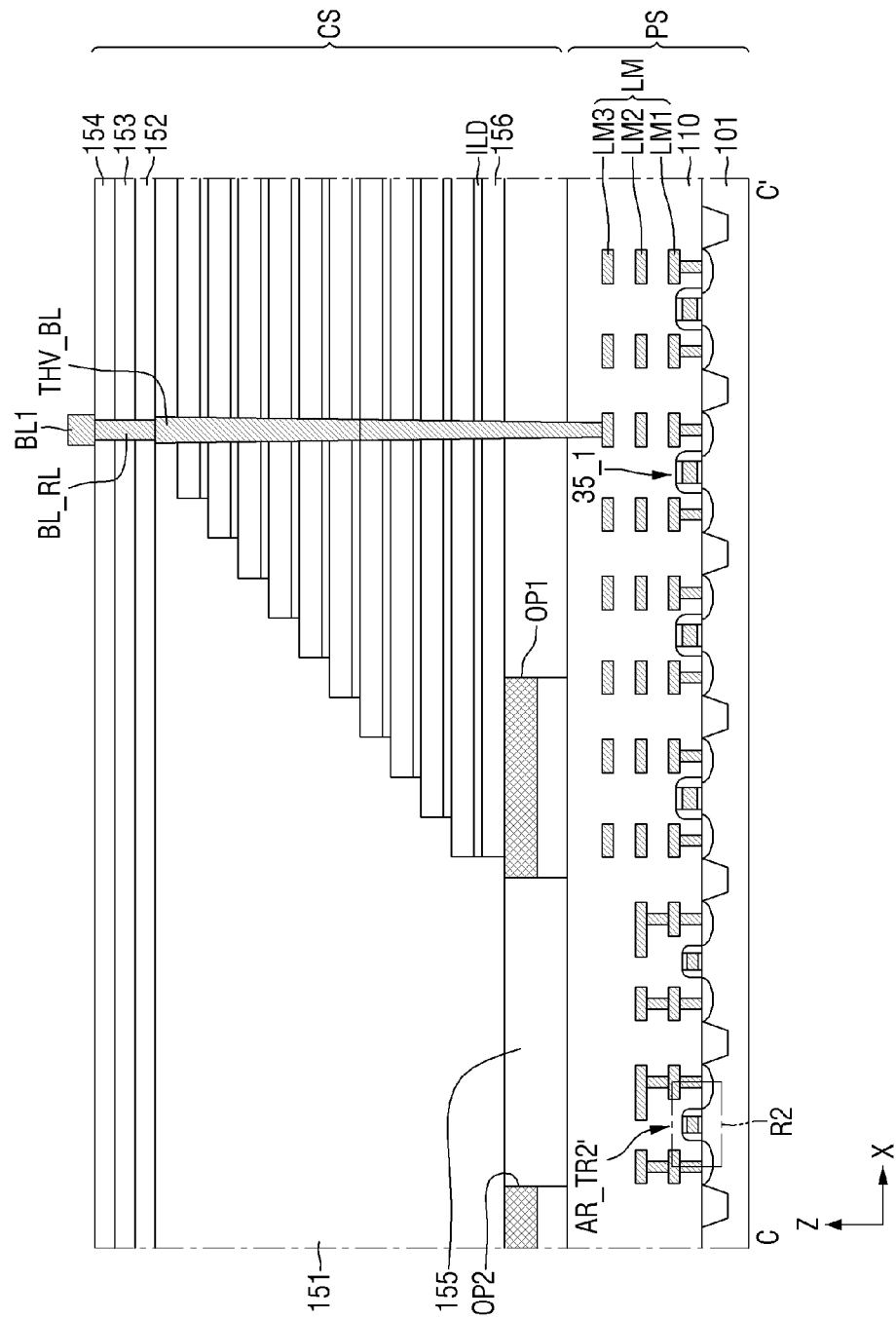
Figure 21:
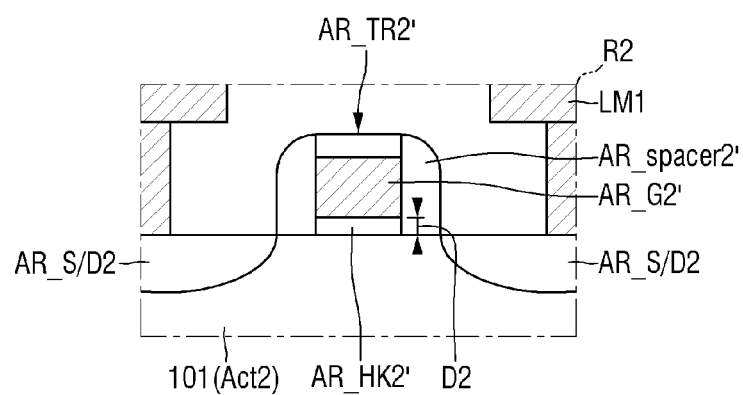

FIG. 17 is a graph illustrating effects of the nonvolatile memory device according to some exemplary embodiments of the present disclosure.

FIG. 17 shows a voltage of each conductive film when a read operation and then a discharge operation are performed on the memory cell blocks BLK1 to BLKn.

The first to tenth operation control transistors OTr1 to OTr10 and the first to tenth discharge transistors DTr1 to DTr10 according to some exemplary embodiments of the present disclosure may be disposed in the active residual region AR_R, and control transistors and pass transistors including the first to tenth operation control transistors OTr1 to OTr10 and the first to tenth discharge transistors DTr1 to DTr10 may be connected through the lower interconnection structure LMS.

Since only the lower interconnection structure LMS has a lower resistance than the through-hole vias THV and the upper interconnections M1 and M2, a case SLa1 of discharging the string select line SSL, the ground select line GSL, and the word lines WL through the lower interconnection structure LMS shows a higher change rate in discharging the string select line SSL and the ground select line GSL than a case SLa2 of discharging the string select line SSL, the ground select line GSL, and the word lines WL without using the lower interconnection structure LMS in a discharge path.

Accordingly, when discharge is performed through the lower interconnection structure LMS, a first voltage difference ΔV1 between the string select line SSL or the ground select line GSL and the word lines WL occurring at a first time t1 is smaller than a second voltage difference ΔV2 of a case of performing discharge without the lower interconnection structure LMS. A case SLb may represents a change in a voltage applied to the word lines WL with respect to time t.

Consequently, hot carrier injection (HCI), which occurs when a voltage difference between the string select line SSL or the ground select line GSL and the word lines WL is considerably increased, is prevented such that performance efficiency of the nonvolatile memory device 1 may be maintained.

A configuration of the peripheral circuit 30 is disposed in the active residual region AR_R to reduce an area occupied by the peripheral circuit 30 such that the chip size of the nonvolatile memory device 1 may be reduced.

FIGS. 18 to 21 are diagrams illustrating a nonvolatile memory device according to some exemplary embodiments of the present disclosure.

A nonvolatile memory device according to some exemplary embodiments of the present disclosure will be described below with reference to FIGS. 18 to 21. The nonvolatile memory device will be described, focusing on differences with the nonvolatile memory device shown in FIGS. 9 to 14.

A tenth pass transistor 33_10 may be connected to control transistors including first to tenth operation control transistors OTr1 to OTr10 and first to tenth discharge transistors DTr1 to DTr10 through a tenth through-hole via THV_10' and a tenth through-via interconnection THV_RL10'.

A source/drain Pass S/D of the tenth pass transistor 33_10 is not connected to active residual region transistors AR_TR1 and AR_TR2 disposed in an active residual region AR_R through a lower interconnection LM.

The active residual region transistors AR_TR1 and AR_TR2 may be included in the eFuse latch included in the control logic 37 of FIG. 2 and may store setting data (e.g., operation mode setting information) for controlling the operation of memory cell blocks BLK1 to BLKn. Accordingly, the active residual region transistors AR_TR1 and AR_TR2 also operate as control transistors which control an operating voltage of the memory cell blocks BLK1 to BLKn.

It is self-evident that description of the first active residual region transistor AR_TR1 may be replaced with description of the second active residual region transistor AR_TR2.

The second active residual region transistor AR_TR2 is adjacent to the tenth pass transistor 33_10, but a low voltage is applied thereto. Accordingly, the second active residual region transistor AR_TR2 may be disposed at a second active region ACT2 different from a first active region ACT1 which is an active region of the tenth pass transistor 33_10. A high-k film AR_HK2' and a gate electrode AR_G2' may be sequentially disposed on the second active region ACT2, and a spacer AR_spacer2' may be disposed on sidewalls of the high-k film AR-_HK2' and the gate electrode AR_G2'.

The second active residual region transistor AR_TR2' only requires data storage among settings of the nonvolatile memory device and thus does not require a high voltage. Accordingly, the second active residual region transistor AR_TR2' is a low-voltage high-current transistor, and the high-k film AR_HK2' includes or is formed of silicon oxide or a high-k insulating film.

A second thickness D2 of the high-k insulating film AR_HK2' is within a range from 0.1 nm to 3 nm.

A voltage applied to the gate electrode AR_G2' is within a range from 0 V to 5 V, and the voltage level is within a range from 0 V to 5 V. A voltage applied to a source/drain AR_S/D2 is within a range from 0 V to 5 V, and the voltage level is within a range from 0 V to 5 V.

In the nonvolatile memory device of FIGS. 18 to 21, a configuration of a peripheral circuit 30 is disposed in the active residual region AR_R to reduce an area occupied by the peripheral circuit 30 such that the chip size of the nonvolatile memory device may be reduced.

Figure 22:
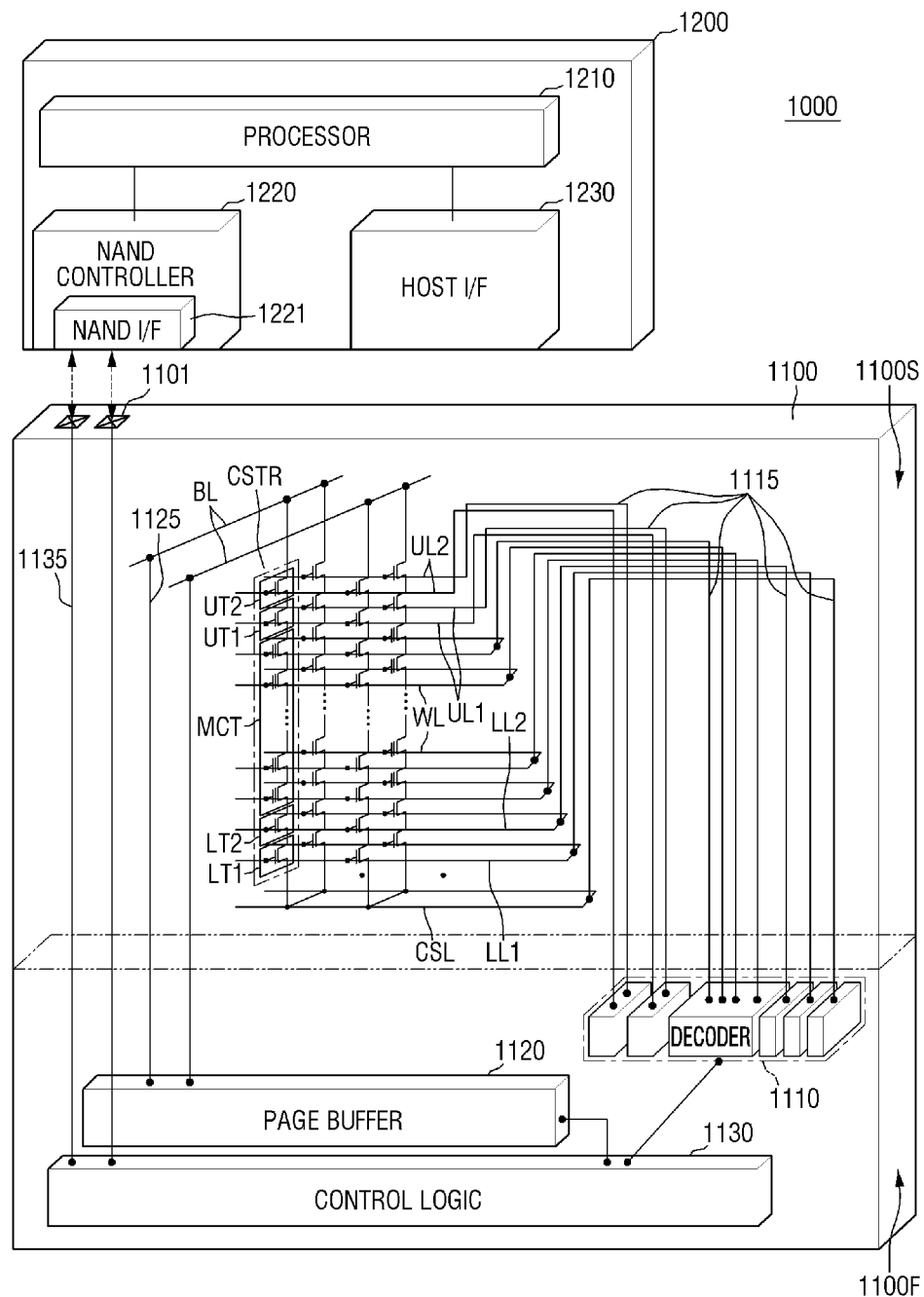
FIG. 22 is a view showing an electronic system including the nonvolatile memory device according to some exemplary embodiments of the present disclosure.

FIG. 22 is a view showing an electronic system including the nonvolatile memory device according to some exemplary embodiments of the present disclosure.

Referring to FIG. 22, an electronic system 1000 according to an exemplary embodiment of the present disclosure may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be an SSD device, a universal serial bus (USB) device, a computing system, a medical device, or a communication device including one or more semiconductor devices 1100.

The semiconductor device 1100 may be a nonvolatile memory device, for example, the NAND flash memory device described above with reference to FIGS. 2 to 16. The semiconductor device 1100 may include a first structure 1100F and a second structure 1100S on the first structure 1100F. In exemplary embodiments, the first structure 1100F may be disposed next to the second structure 1100S. The first structure 1100F may be a peripheral circuit structure including a row decoder 1110, a page buffer 1120, and a control logic 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary depending on embodiments.

In exemplary embodiments, the upper transistors UT1 and UT2 may include SSTs, and the lower transistors LT1 and LT2 may include GSTs. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The controller 1200 may include a processor 1210, a NAND controller 1220, and a host interface 1230. According to exemplary embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to certain firmware and access the semiconductor device 1100 by controlling the NAND controller 1220. The NAND controller 1220 may include a NAND interface 1221 which processes communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100, etc. may be transmitted. The host interface 1230 may provide a communication function between the electronic system 1000 and an external host. When a control command is received from the external host through the host interface 1230, the processor 1210 may control the semiconductor device 1100 in response to the control command.

Figure 23:
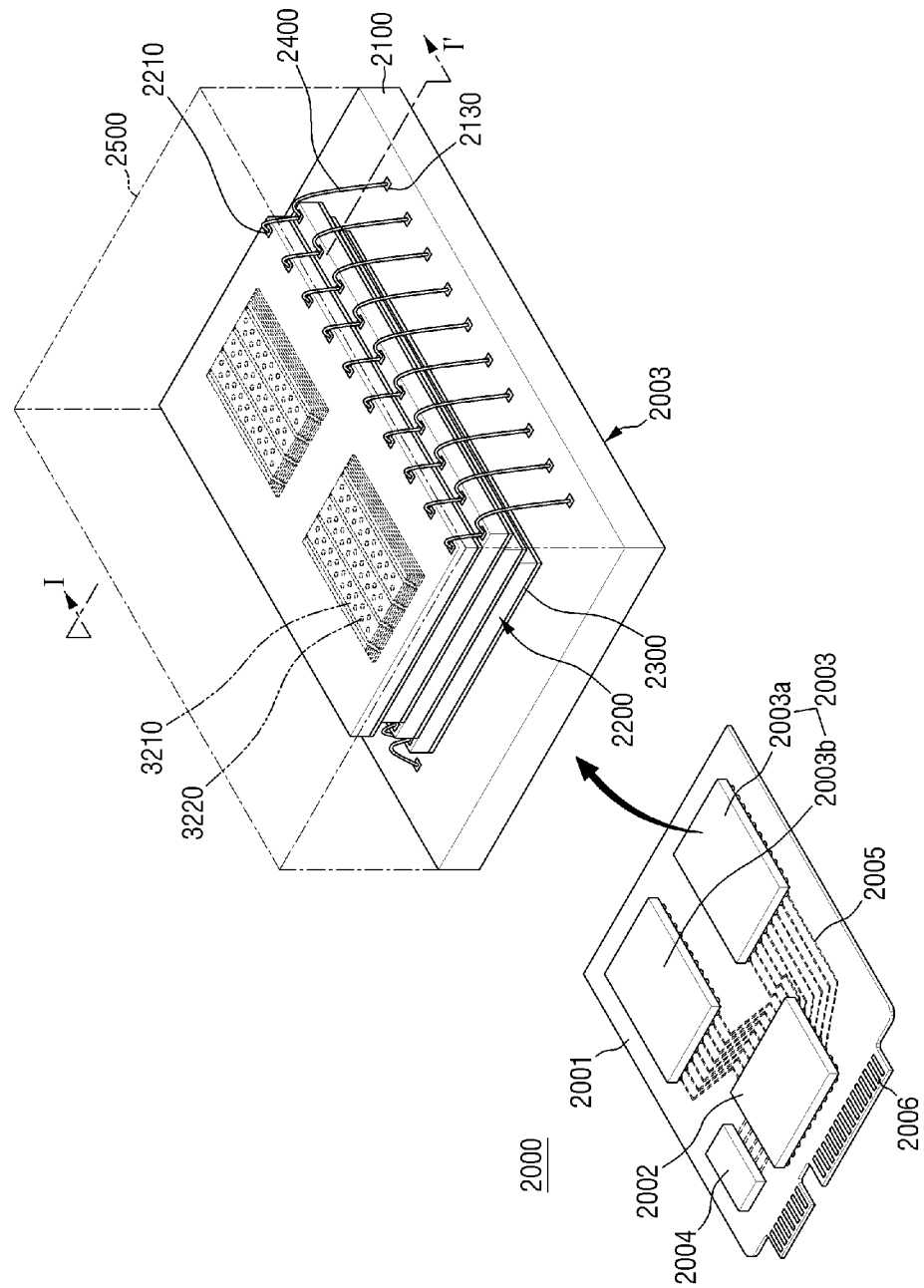
FIG. 23 is a perspective view showing an electronic system including the nonvolatile memory device according to some exemplary embodiments of the present disclosure.

FIG. 23 is a perspective view showing an electronic system including the nonvolatile memory device according to some exemplary embodiments of the present disclosure.

Referring to FIG. 23, an electronic system 2000 according to an exemplary embodiment of the present disclosure may include a main board 2001, a controller 2002 mounted on the main board 2001, one or more semiconductor packages 2003, and a dynamic RAM (DRAM) 2004. The semiconductor packages 2003 and the DRAM 2004 may be connected to the controller 2002 through interconnection patterns 2005 formed on the main board 2001.

The main board 2001 may include a connector 2006 including a plurality of pins coupled to an external host. In the connector 2006, the number and arrangement of pins may vary according to a communication interface between the electronic system 2000 and the external host. In exemplary embodiments, the electronic system 2000 may communicate with the external host according to any one of a USB interface, a peripheral component interconnect (PCI)-express interface, a serial advanced technology attachment (SATA) interface, an M-PHY interface for universal flash storage (UFS), and the like. In exemplary embodiments, the electronic system 2000 may operate with power received from the external host through the connector 2006. The electronic system 2000 may further include a power management integrated circuit (PMIC) which distributes the power received from the external host to the controller 2002 and the semiconductor packages 2003.

The controller 2002 may write data to the semiconductor packages 2003 or read data from the semiconductor packages 2003 and may increase an operating speed of the electronic system 2000.

The DRAM 2004 may be a buffer memory for reducing a speed difference between the semiconductor packages 2003, which are data storage spaces, and the external host. The DRAM 2004 included in the electronic system 2000 may also operate as a cache memory and provide a space for temporarily storing data during a control operation for the semiconductor packages 2003. When the DRAM 2004 is included in the electronic system 2000, the controller 2002 may include a DRAM controller for controlling the DRAM 2004 in addition to a NAND controller for controlling the semiconductor package 2003.

The semiconductor packages 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 each disposed under lower surfaces of the semiconductor chips 2200, connection structures 2400 which electrically connect the semiconductor chips 2200 to the package substrate 2100, and a molding layer 2500 which covers the semiconductor chips 2200 and the connection structures 2400 on the package substrate 2100.

The package substrate 2100 may be a printed circuit board including package upper pads 2130. Each of the semiconductor chips 2200 may include input/output pads 2210. The input/output pads 2210 may correspond to input/output pads 1101 of FIG. 22. Each of the semiconductor chips 2200 may include a stacked structure 3210 and a plurality of vertical structures 3220. Each of the semiconductor chips 2200 may include the nonvolatile memory device 1 described above with reference to FIGS. 1 to 14.

In exemplary embodiments, the connection structures 2400 may be bonding wires which electrically connect the input/output pads 2210 to the package upper pads 2130. Accordingly, in each of the first and second semiconductor packages 2003a and 2003b, the semiconductor chips 2200 may be electrically connected to each other by wire bonding and may be electrically connected to the package upper pads 2130 of the package substrate 2100. According to exemplary embodiments, in each of the first and second semiconductor packages 2003a and 2003b, the semiconductor chips 2200 may be electrically connected to each other through connection structures including through-silicon vias (TSVs) rather than the wire-bonding connection structures 2400.

In exemplary embodiments, the controller 2002 and the semiconductor chips 2200 may be included in one package. In exemplary embodiments, the controller 2002 and the semiconductor chips 2200 may be mounted on interposer substrates, which are different from the main board 2001, and the controller 2002 and the semiconductor chips 2200 may be connected to each other by interconnections formed on the interposer substrate.

Figure 24:
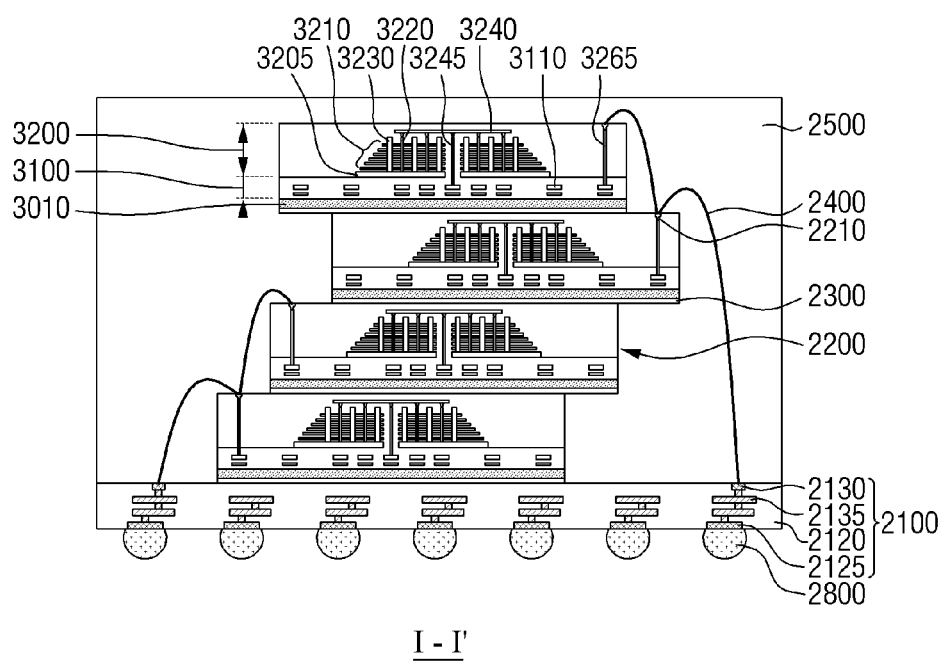
FIG. 24 is a cross-sectional view showing semiconductor packages according to some exemplary embodiments of the present disclosure.

FIG. 24 is a cross-sectional view showing semiconductor packages according to some exemplary embodiments of the present disclosure.

FIG. 24 illustrates an exemplary embodiment of the semiconductor packages 2003 of FIG. 23 and conceptually shows a cross-sectional view of the semiconductor package 2003 taken along line I-I' of FIG. 23.

Referring to FIG. 24, in the semiconductor package 2003, the package substrate 2100 may be a printed circuit board. The package substrate 2100 may include a package substrate body 2120, package upper pads 2130 disposed on an upper surface of the package substrate body 2120, lower pads 2125 disposed on a lower surface of the package substrate body 2120 or exposed through the lower surface, and internal interconnections 2135 which electrically connect the upper pads 2130 to the lower pads 2125 in the package substrate body 2120. The upper pads 2130 may be electrically connected to connection structures 2400. The lower pads 2125 may be connected to the interconnection patterns 2005 of the main board 2001 of the electronic system 2000 as shown in FIG. 23.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral interconnections 3110. The second structure 3200 may include a common source plate 3205, a stacked structure 3210 on the common source plate 3205, vertical structures 3220 and electrode separation regions 3230 passing through the stacked structure 3210, bit lines 3240 electrically connected to the vertical structures 3220, and the word line contacts of FIG. 9 electrically connected to the word lines WL (see FIG. 22) of the stacked structure 3210.

Each of the semiconductor chips 2200 may include a through interconnection 3245 which is electrically connected to the peripheral interconnections 3110 of the first structure 3100 and extends into the second structure 3200. The through interconnection 3245 may pass through the stacked structure 3210 and may be additionally disposed outside the stacked structure 3210. Each of the semiconductor chips 2200 may further include an input/output interconnection 3265, which is electrically connected to the peripheral interconnections 3110 of the first structure 3100 and extends into the second structure 3200, and an input/output pad 2210 which is electrically connected to the input/output interconnection 3265.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nonvolatile memory device comprising:
   a peripheral logic structure including a peripheral circuit on a substrate;
   a horizontal semiconductor layer extending along an upper surface of the peripheral logic structure;
   a plurality of stacked structures spaced apart from each other in a first horizontal direction on the horizontal semiconductor layer when viewed in a plan view,
   wherein each of the plurality of stacked structures includes a plurality of interlayer insulating films and a plurality of conductive films alternately stacked in a vertical direction perpendicular to an upper surface of the substrate, wherein the first horizontal direction is parallel to the upper surface of the substrate;
a first opening disposed between two adjacent stacked structures of the plurality of stacked structures and included in the horizontal semiconductor layer to expose a part of the peripheral logic structure; and
a second opening arranged in a second horizontal direction, which is perpendicular to the first horizontal direction, from the first opening, included in the horizontal semiconductor layer, and disposed adjacent to the first opening,
wherein the second horizontal direction is parallel to the upper surface of the substrate, and
wherein the peripheral logic structure includes control logic with a control transistor overlapping a region defined by the second opening when viewed in the plan view and the control logic is configured to control operation of the plurality of stacked structures.

2. The nonvolatile memory device of claim 1, further comprising:
a pass transistor configured to apply an operating voltage to a corresponding one of the plurality of conductive films and disposed in the peripheral logic structure,
wherein a voltage applied to a source/drain of the pass transistor is within a range from 0 V to 30 V, and
wherein a voltage applied to a source/drain of the control transistor is within a range from 0 V to 5 V.

3. The nonvolatile memory device of claim 2,
wherein the pass transistor is disposed at a first active region of the substrate, and
wherein the control transistor is separated from the first active region and disposed at a second active region of the substrate.

4. The nonvolatile memory device of claim 1, further comprising:
a through-hole via connected to the peripheral logic structure through the first opening.

5. The nonvolatile memory device of claim 4, further comprising:
a channel hole passing through the plurality of stacked structures;
a channel structure extending along a sidewall of the channel hole; and
an upper interconnection electrically connected to the channel structure and extending on the plurality of stacked structures,
wherein the upper interconnection is electrically connected to the through-hole via.

6. The nonvolatile memory device of claim 1, further comprising:
a pass transistor configured to apply an operating voltage to a corresponding one of the plurality of conductive films and disposed in the peripheral logic structure,
wherein the control logic is configured to control the operating voltage,
wherein the control transistor of the control logic is connected to a source/drain of the pass transistor, and
wherein the control transistor and the pass transistor are connected through a lower interconnection structure which is disposed below the upper surface of the peripheral logic structure.

7. The nonvolatile memory device of claim 6,
wherein the control transistor includes a discharge transistor of which a source/drain is grounded, and
wherein the discharge transistor is configured to discharge the operating voltage of the corresponding one of the plurality of conductive films through the pass transistor.

8. The nonvolatile memory device of claim 6,
wherein the pass transistor overlaps a region defined by a third opening, which is arranged in the first horizontal direction from the second opening, when viewed in the plan view.

9. The nonvolatile memory device of claim 6,
wherein the pass transistor and the control transistor are disposed at the same active region of the substrate.

10. A nonvolatile memory device comprising:
a peripheral logic structure including a peripheral circuit on a substrate;
a horizontal semiconductor layer extending along an upper surface of the peripheral logic structure;
a first stacked structure including a first conductive film stacked on the horizontal semiconductor layer in a vertical direction perpendicular to an upper surface of the substrate;
a pass transistor configured to apply an operating voltage to the first conductive film and disposed in the peripheral logic structure;
a control transistor connected to a source/drain of the pass transistor,
wherein the peripheral circuit includes control logic configured to control the operating voltage and the control logic includes the control transistor, and wherein the control transistor and the pass transistor are connected through a lower interconnection structure which is disposed under the upper surface of the peripheral logic structure; and
a second stacked structure spaced apart from the first stacked structure in a first horizontal direction on the horizontal semiconductor layer,
wherein the first horizontal direction is parallel to the upper surface of the substrate, and wherein the second stacked structure includes a second conductive film stacked in the vertical direction perpendicular to the substrate,
wherein the horizontal semiconductor layer comprises:
a first opening disposed between the first and second stacked structures and exposing a part of the peripheral logic structure; and
a second opening arranged in a second horizontal direction, which differs from the first horizontal direction, from the first opening, and disposed adjacent to the first opening,
wherein the second horizontal direction is parallel to the upper surface of the substrate, and
wherein the control transistor overlaps a region defined by the second opening when viewed in a plan view.

11. The nonvolatile memory device of claim 10, further comprising:
a through-hole via connected to the peripheral logic structure through the first opening.

12. The nonvolatile memory device of claim 10,
wherein the pass transistor and the control transistor are disposed at the same active region of the substrate.

13. The nonvolatile memory device of claim 10,
wherein the control transistor includes a discharge transistor of which a source/drain is grounded, and
wherein the discharge transistor is configured to discharge the operating voltage of the first conductive film through the pass transistor.

14. The nonvolatile memory device of claim 10,
wherein the pass transistor overlaps a region defined by a third opening arranged in the first horizontal direction from the second opening when viewed in the plan view.

15. The nonvolatile memory device of claim 14,
wherein the third opening and the first stacked structure are arranged in one line in the second horizontal direction.

16. A nonvolatile memory system comprising:
a main board;
a nonvolatile memory device disposed on the main board; and
a controller disposed on the main board and electrically connected to the nonvolatile memory device,
wherein the nonvolatile memory device includes:
a peripheral logic structure including a peripheral circuit on a substrate;
a horizontal semiconductor layer extending along an upper surface of the peripheral logic structure;
a plurality of stacked structures spaced apart from each other in a first horizontal direction on the horizontal semiconductor layer when viewed in a plan view,
wherein each of the plurality of stacked structures includes a plurality of interlayer insulating films and a plurality of conductive films alternately stacked in a vertical direction perpendicular to an upper surface of the substrate, where the first horizontal direction is parallel to the upper surface of the substrate;
a first opening disposed between two adjacent stacked structures of the plurality of stacked structures and included in the horizontal semiconductor layer to expose a part of the peripheral logic structure; and
a second opening arranged in a second horizontal direction, which is perpendicular to the first horizontal direction, from the first opening, included in the horizontal semiconductor layer, and disposed adjacent to the first opening,
wherein the second horizontal direction is parallel to the upper surface of the substrate, and
wherein the peripheral logic structure includes control logic with a control transistor overlapping a region defined by the second opening when viewed in the plan view and the control logic is configured to control operation of the plurality of stacked structures.

17. The nonvolatile memory system of claim 16, further comprising:
a pass transistor configured to apply an operating voltage to a corresponding one of the plurality of conductive films and disposed in the peripheral logic structure,
wherein a voltage applied to a source/drain of the pass transistor is within a range from 0 V to 30 V, and
wherein a voltage applied to a source/drain of the control transistor is within a range from 0 V to 5 V.

18. The nonvolatile memory system of claim 16, further comprising:
a pass transistor configured to apply an operating voltage to the conductive films and disposed in the peripheral logic structure,
wherein the control logic is configured to control the operating voltage,
wherein the control transistor of the control logic is connected to a source/drain of the pass transistor, and
wherein the control transistor and the pass transistor are connected through a lower interconnection structure which is disposed below the upper surface of the peripheral logic structure.

19. The nonvolatile memory system of claim 18,
wherein the pass transistor and the control transistor are disposed at the same active region of the substrate.

* * * * *